(12) United States Patent
Kuge et al.

(10) Patent No.: US 6,850,454 B2
(45) Date of Patent: Feb. 1, 2005

(54) SEMICONDUCTOR MEMORY DEVICE WITH REDUCED CURRENT CONSUMPTION DURING STANDBY STATE

(75) Inventors: Shigehiro Kuge, Hyogo (JP); Takeshi Hamamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/626,643

(22) Filed: Jul. 25, 2003

(65) Prior Publication Data

US 2004/0145959 A1 Jul. 29, 2004

(30) Foreign Application Priority Data

Jan. 29, 2003 (JP) ........................................ 2003-020267

(51) Int. Cl.[7] .............................................. G11C 7/00
(52) U.S. Cl. .................. 365/227; 365/230.03; 365/222
(58) Field of Search ................................ 365/222, 227, 365/230.03

(56) References Cited

U.S. PATENT DOCUMENTS 5,251,176 A * 10/1993 Komatsu .................... 365/222
6,058,061 A * 5/2000 Ooishi ......................... 365/222
6,091,659 A * 7/2000 Watanabe et al. ....... 365/230.03
6,563,748 B2 * 5/2003 Hidaka ........................ 365/198

FOREIGN PATENT DOCUMENTS

| JP | 6-28856 | 2/1994 |
| JP | 9-83266 | 3/1997 |

* cited by examiner

*Primary Examiner*—Son Mai
(74) *Attorney, Agent, or Firm*—McDermott Will & Emery LLP

(57) ABSTRACT

Data indicating whether a short-circuit defect exists in a memory block is programmed a fuse program circuit. In accordance with the fuse program data and a mode instruction signal, the correspondence relationship between a block select signal and a corresponding bit line isolation instruction signal is switched by a circuit that generates the bit line isolation instruction signal in a specific mode. It becomes possible to isolate the memory block in which a leakage current path exists from a corresponding sense amplifier band in a specific operation mode. Current consumption at least at a standby state is reduced.

11 Claims, 19 Drawing Sheets

SEMICONDUCTOR MEMORY DEVICE WITH REDUCED CURRENT CONSUMPTION DURING STANDBY STATE

BACKGROUND OF THE INVENTION

1. Field of the Invention

The present invention relates to a semiconductor memory device and, particularly, to a dynamic type semiconductor memory device that requires a refresh operation for data retention. More specifically, the present invention relates to a configuration for reducing current consumption during a stand-by state, particularly, in a data holding mode.

2. Description of the Background Art

In a dynamic semiconductor memory device (DRAM: Dynamic Random Access Memory), data is stored in a capacitor in the form of charges. At accessing of data in a memory cell, the charges stored in the capacitor are read to a corresponding bit line. The bit line is precharged at a predetermined voltage level in a standby state. A sense amplifier provided in correspondence to the bit line detects the voltage change generated on the bit line and the memory cell data is read. The voltage of the bit line fully swings by the amplification operation of the sense amplifier, so that data is rewritten to the memory cell.

In DRAM, a shared sense amplifier configuration is generally employed, in which a memory cell array is divided into blocks and adjacent blocks share sense amplifiers so as to decrease the load of sense amplifiers. A selected memory block including a selected memory cell is connected to the corresponding sense amplifiers, and the unselected memory block which shares the sense amplifiers with the selected memory block is isolated from the corresponding sense amplifiers. In order to perform this connection/isolation between the sense amplifier and the bit line of the memory block, a bit line isolation gate is provided for each bit line.

In order to drive the bit line to power supply voltage level by the sense amplifier, a signal having a high voltage level higher than a sense power supply voltage is applied, as a bit line isolation control signal, to this bit line isolation gate. A configuration intended to reduce current consumption in generating a bit line isolation control signal at a high voltage level is disclosed in, for example, Prior Art Document 1 (Japanese Patent Laying-Open No. 6-28856). According to Prior Art Document 1, the bit line isolation control signal is maintained at power supply voltage level in a standby state and driven to a high voltage level when a selected memory cell is connected to a sense amplifier. In a refresh mode for holding data, the voltage of the bit line isolation control signal for a selected memory block is boosted from the power supply voltage level to high voltage level at starting of a sensing operation, the boosting is stopped after the completion of the sensing operation, and the bit line isolation control signal is maintained at the power supply voltage level. Thus, a time period in which the bit line isolation control signal at the high voltage level is generated is shortened, thereby reducing current consumption.

Further, Prior Art Document 2 (Japanese Patent Laying-Open No. 9-63266) discloses a configuration intended to reduce current consumption in a self refresh mode for periodically performing a refresh operation internally. According to Prior Art Document 2, after memory cell data is transmitted to a sense amplifier in the self refresh mode, a bit line is isolated from the sense amplifier. In this state, the sense amplifier is activated. The sense node of the sense amplifier is isolated from the bit line, and, therefore, the parasitic capacitance at the sense node is small, a sensing operation is performed at high speed, a through current flowing from the sense power supply node of the sense amplifier to the sense ground node thereof during a transition state is decreased, and current consumption is thereby reduced. After the completion of the sensing operation, a bit line isolation instruction signal is driven to the high voltage level, and data latched by the sense amplifier is written to an original memory cell.

According to Prior Art Documents 1 and 2 described above, the manner of generating the bit line isolation control signal at the refresh mode is different from that in a normal operation mode. According to Prior Art Document 1, the consumption of current required to boost the voltage of the bit line isolation control signal is intended to be reduced. According to Prior Art Document 2, the through current of the sense amplifier is intended to be reduced in the sensing operation. However, these Prior Art Documents 1 and 2 fail to consider the current consumption due to the existence of a leakage path caused by a particle (contaminant) such as etching residue in a manufacturing process.

In the DRAM, word lines and bit lines are arranged in directions crossing each other. When a particle remains in a manufacturing process, a word line may be electrically connected to a corresponding bit line through the contaminant. When this contaminant is an electric conductor, the word line is short-circuited to the bit lines. When this short circuit is low-resistive, the selected word line is not driven to a select state in the DRAM or the voltage level of the bit line is fixed by the unselected word line, thus causing malfunctions such as a state where memory cell data cannot be read. As a result, the DRAM is identified as a defective product during a test.

When this short circuit is a high resistance, the DRAM operates normally. However, even when this short circuit is the high resistance, the word line is electrically connected to the bit line, and therefore, in a standby state, when the bit lines are precharged at a predetermined voltage level, a current flows from the bit line to the word line through the high resistance of the short circuit.

In a standby state, the sense amplifier is electrically disconnected from sense power source lines (a sense power supply line and a sense ground line). However, the common source node of the sense amplifier (connection node connected to a sense amplifier activation transistor) is precharged at the same voltage level as that of the bit line. In the standby state, the bit line isolation gate is made conductive, so that a current flows from the common source node of the sense amplifier to the word line through the bit line and the high resistance.

When the DRAM is applied to portable equipment driven by a battery, DRAM is required to have a very low standby current or ultra low standby current according to the specification of the applied system. In this case, the quantity of a leakage current through the high resistance becomes significantly innegligible. In an operation mode such as a self refresh mode for holding data, in particular, data is not accessed but only held. Therefore, it is required to further reduce current consumption in view of the life of the battery.

Although Prior Art Documents 1 and 2 described previously intend to reduce current consumption in the refresh mode, they do not consider the problem of the leakage current flowing between a word line and a bit line through the high resistance.

SUMMARY OF THE INVENTION

It is an object of the present invention to provide a semiconductor memory device capable of reducing current consumption in a standby state.

It is another object of the present invention to provide a semiconductor memory device capable of further reducing current consumption in a data holding mode.

A semiconductor memory device according to the present invention includes: a plurality of memory blocks each having a plurality of memory cells arranged in rows and columns; a plurality of sense amplifier bands, arranged in correspondence to the plurality of memory blocks so as to be shared between adjacent memory blocks, each including a plurality of sense amplifiers, when activated, sensing and amplifying data in the memory cells in a corresponding memory block; a plurality of bit line isolation circuits, arranged in correspondence to the plurality of sense amplifier bands, for electrically connecting the corresponding sense amplifier bands to the corresponding memory blocks when made conductive; and a bit line isolation control circuit for setting the bit line isolation circuit provided in correspondence to at least specific memory block to be made nonconductive in a standby operation mode.

In the shared sense amplifier configuration, the bit line isolation circuit for the at least specific memory block is set to be made nonconductive in a standby state. As a result, even when a word line is short-circuited to a bit line in this specific memory block, it is possible to prevent a leakage current from flowing from the sense amplifier band through this short circuit, thereby reducing current consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
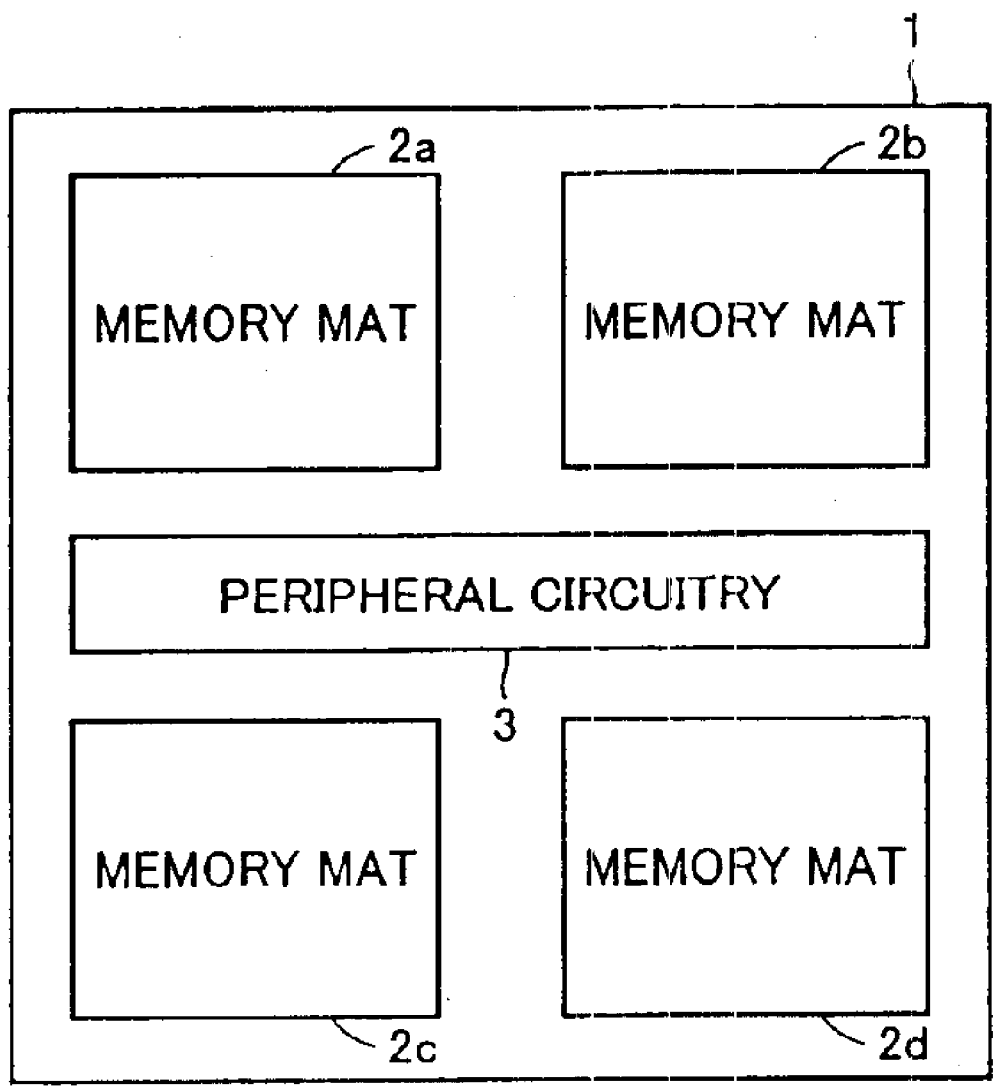
FIG. 1 is a schematic diagram showing an overall configuration of a semiconductor memory device according to the present invention.

FIG. 1 is a schematic diagram showing an overall configuration of a semiconductor memory device according to the present invention. In FIG. 1, semiconductor memory device 1 includes memory mats 2a to 2d arranged being distributed in four-divided regions, and peripheral circuitry 3 arranged in the region between memory mats 2a and 2b and memory mats 2c and 2d.

Each of memory mats 2a to 2d includes a memory array having a plurality of memory cells arranged in rows and columns, a row select circuit selecting a memory cell row, and a column select circuit selecting a memory cell column. In each of memory mats 2a to 2d, memory cells are arranged being divided into a plurality of memory blocks, and sense amplifier bands are arranged, corresponding to the memory blocks, such that a sense amplifier is shared between a memory block and an adjacent memory block.

Peripheral circuitry 3 includes an input/output circuit inputting and outputting data, an input buffer receiving an external address signal and an external control signal, and a main control circuit generating an operation control signal for memory mats 2a to 2d.

Memory mats 2a to 2d may form a plurality of banks. In addition, one of memory mats 2a to 2d may be selected or a plurality of memory mats may be simultaneously selected in row selection. Further, the number of memory mats selected simultaneously may be set different between the normal mode of operation and the self refresh mode performed in the data holding mode.

Figure 2:
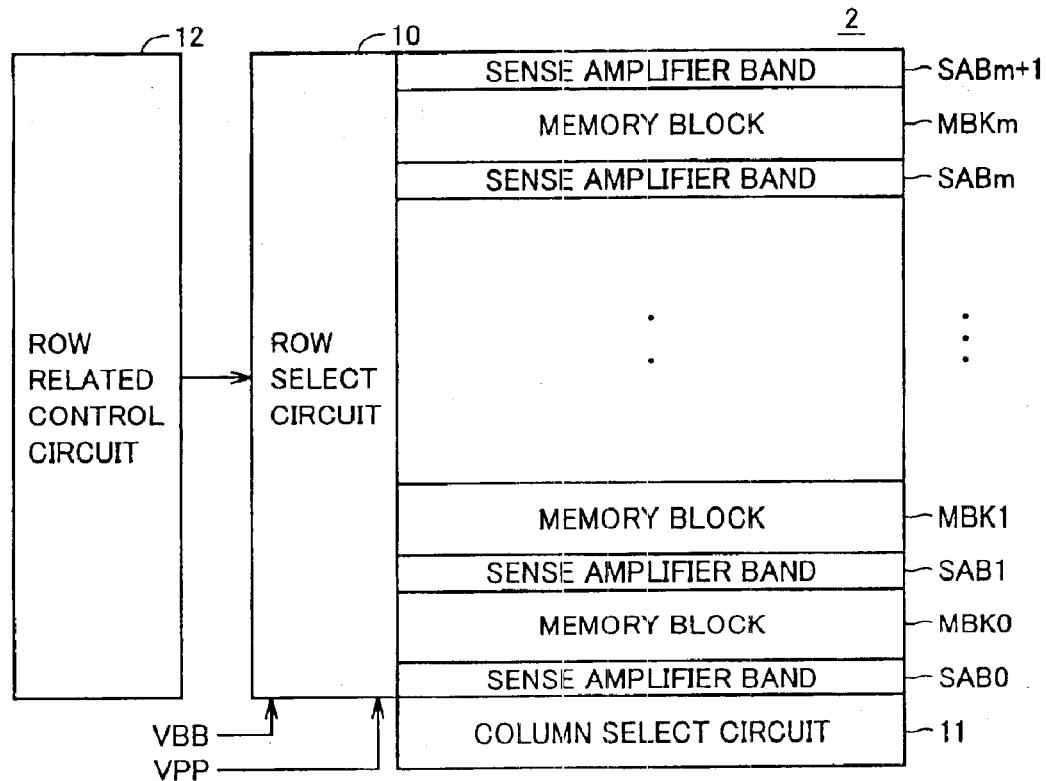
FIG. 2 is a schematic diagram showing a configuration of a memory mat shown in FIG. 1.

FIG. 2 is a schematic diagram showing the configuration of each of memory mats 2a to 2d shown in FIG. 1. Since memory mats 2a to 2d are identical in configuration, FIG. 2 representatively shows the configuration of one memory mat 2. In FIG. 2, memory mat 2 includes memory blocks MBK0 to MBKm each having a plurality of memory cells arranged in rows and columns, sense amplifier bands SAB1 to SABm arranged among memory blocks MBK0 to MBKm, and sense amplifier bands SAB0 and SABm+1 arranged outsides memory blocks MBK0 and MBKm, respectively.

Each of sense amplifier bands SAB1 to SABm is shared between the memory blocks arranged on both sides of the sense amplifier band. Each of sense amplifier bands SAB0 and SABm+1 includes a sense amplifier arranged in correspondence to a memory cell column (a bit line pair) of the corresponding memory block. When the corresponding memory block is selected, the sense amplifier band is activated to sense, amplify and latch data in the memory cells in the corresponding memory block.

Memory mat 2 further includes a row select circuit 10 for selecting a row (word line) in memory blocks MBK0 to MBKm, and a column select circuit 11 for selecting a column in memory blocks MBK0 to MBKm. A negative voltage VBB and a high voltage VPP are applied to row select circuit 10. Row select circuit 10 maintains unselected word lines at negative voltage VBB level and transmits high voltage VPP to a selected word line. The operation of row select circuit 10 is controlled by a row related control circuit 12. Row related control circuit 12 controls the operations of circuits, such as row select circuit 10, related to row selection in accordance with a main row related control signal from the main control circuit included in peripheral circuitry 3 shown in FIG. 1.

A bit line isolation circuit connecting the sense amplifier band to the corresponding memory block is arranged between the sense amplifier band and the corresponding memory block. However, in order to simplify illustration, FIG. 2 does not show the bit line isolation circuit.

Under the control of row related control circuit 12, the bit line isolation circuit, not shown, is controlled to be made conductive or nonconductive. In a self refresh mode, memory blocks MBK0 to MBKm are isolated from corresponding sense amplifier bands SAB0 to SABm+1. Only a selected memory block is coupled to the corresponding sense amplifier band and memory cell data is refreshed in the selected memory block. By isolating the sense amplifier bands from the corresponding memory blocks in the self refresh mode, even when a short circuit exists between a word line and a bit line, a path, through which leakage current flows from the sense amplifiers in a sense amplifier band through the short circuit, is shut off.

In a normal operation mode, sense amplifier bands SAB0 to SABm+1 are connected to corresponding memory blocks MBK0 to MBKm in a standby state. In an active cycle in which row selection is performed, the unselected memory block that shares the sense amplifier band with the selected memory block is isolated from the corresponding sense amplifier band.

The connection between the sense amplifier band and the corresponding memory block is achieved by selectively setting the bit line isolation circuit to be made conductive or nonconductive under the control of row related control circuit 12. The control of the conductive/nonconductive state of the bit line isolation circuit differs between the normal operation mode and a data holding mode.

Figure 3:
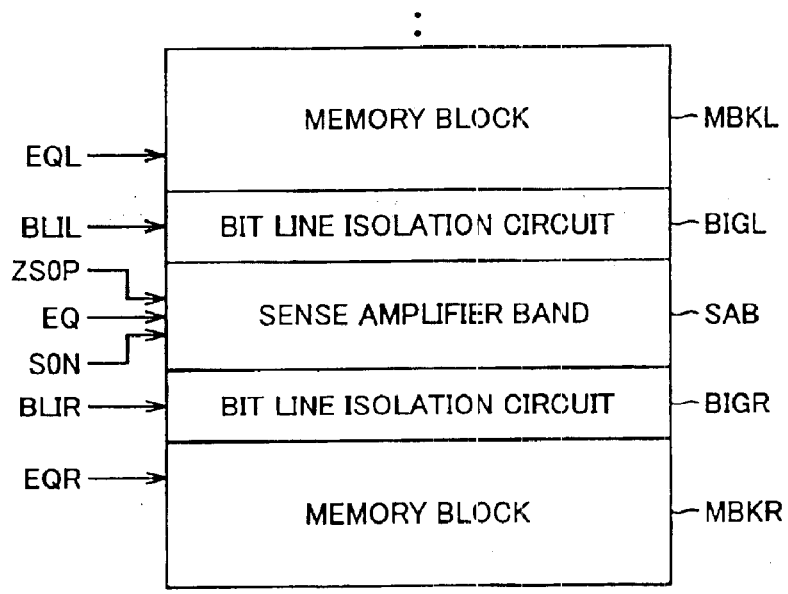
FIG. 3 shows a configuration of a sense amplifier band shown in FIG. 2.

FIG. 3 shows the configuration of the section related to each sense amplifier band shown in FIG. 2. In FIG. 3, a sense amplifier band SAB representing sense amplifier bands SAB0 to SABm+1 is shown. Sense amplifier SAB is arranged between memory blocks MBKL and MBKR. Sense amplifier band SAB includes sense amplifier circuits arranged in correspondence to the memory cell columns (bit line pairs) of memory blocks MBKL and MBKR.

Between sense amplifier band SAB and memory block MBKL, there is provided a bit line isolation circuit BIGL coupling the bit line pairs of memory block MBKL to a sense amplifier circuit group of sense amplifier band SAB in accordance with a bit line isolation instruction signal BLIL. Between sense amplifier band SAB and memory block MBKR, there is provided a bit line isolation circuit BIGR connecting the bit line pairs of memory block MBKR to the sense amplifier circuits of sense amplifier band SAB in accordance with a bit line isolation instruction signal BLIR.

Sense amplifier activation signals ZSOP and SON and a sense node equalization instruction signal EQ are applied to the sense amplifier circuits of sense amplifier band SAB. Sense amplifier activation signal SON is used to activate an N-sense amplifier included in the sense amplifier circuit, while sense amplifier activation signal ZSOP is used to activate a P-sense amplifier included in the sense amplifier circuit. The N-sense amplifier is formed of cross-coupled N-channel MIS transistors (insulated gate field effect transistors). The P-sense amplifier is formed of cross-coupled P-channel MIS transistors. Sense equalization instruction signal EQ precharges the internal power supply node (common source node) of each of the P-sense amplifier and the N-sense amplifier at a predetermined voltage level.

In each of memory blocks MBKL and MBKR, memory cells are arranged in rows and columns. A bit line pair is arranged in correspondence to each memory cell column, and a bit line precharge/equalization circuit is arranged in correspondence to each bit line pair. A bit line equalization instruction signal EQL is applied to the bit line precharge/equalization circuit of memory block MBKL, while a bit line equalization instruction signal EQR is applied to the bit line precharge/equalization circuit of memory block MBKR.

Figure 4:
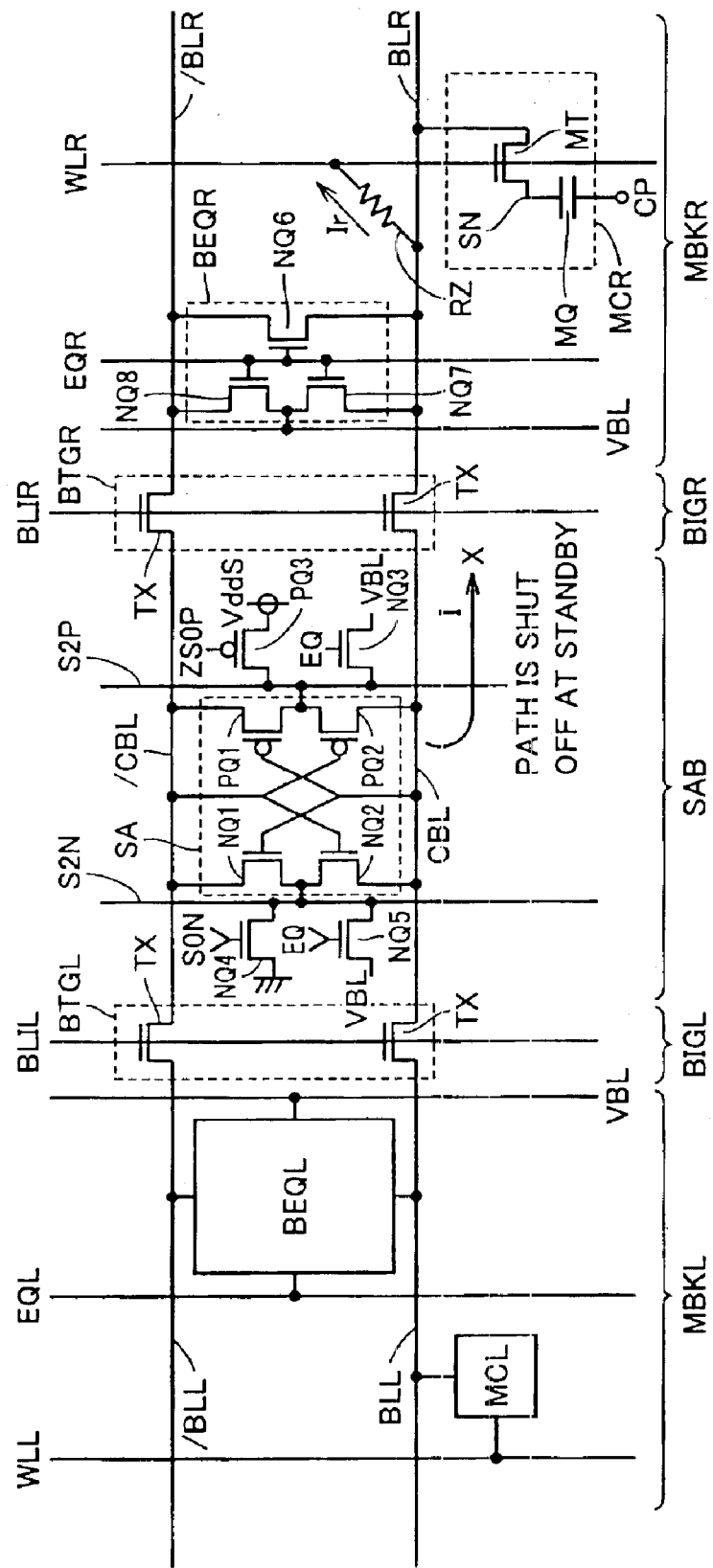
FIG. 4 specifically shows a configuration of a bit line isolation circuit and the sense amplifier shown in FIG. 2.

FIG. 4 shows an example of the specific configuration of sense amplifier band SAB shown in FIG. 3. FIG. 4 shows the configuration provided in correspondence to one column of memory cells (bit line pairs) in each of memory blocks MBKL and MBKR.

In memory block MBKR, a bit line pair BLR and /BLR are provided in correspondence to the column of memory cells MCR. A bit line precharge/equalization circuit BEQR, which precharges bit lines BLR and /BLR at predetermined precharge voltage VBL level and equalizes bit lines BLR and /BLR in response to bit line equalization instruction signal EQR, is provided for bit line pair BLR and /BLR. Memory cell MCR includes a capacitor MQ storing data and an access transistor MT connecting memory cell capacitor MQ to corresponding bit line BLR in response to a signal on a corresponding word line WLR.

Memory cell capacitor MQ has a cell plate electrode CP and a storage node electrode SN. Charges according to the stored data are accumulated at storage node electrode SN. Normally, a cell plate voltage equal in voltage level to bit line precharge voltage VBL is applied to cell plate electrode CP. Access transistor MT is formed of an N-channel MIS. Word line WLR is connected to the access transistors of the memory cells arranged in one row in memory block MBKR. Word line WLR is driven to high voltage VPP level when selected, and maintained at negative voltage VBB level when unselected.

Bit line precharge/equalization circuit BEQR includes an N-channel MIS transistor NQ6 which is made conductive in response to bit line equalization instruction signal EQR and short-circuits bit line BLR and bit line /BLR with each other when made conductive, and N-channel MIS transistors NQ7 and NQ8 which are made conductive in response to bit line equalization instruction signal EQR and transmit bit line precharge voltage VBL to bit lines BLR and /BLR, respectively.

In memory block MBKL, similarly to memory block MBKR, a bit line pair BLL and /BLL are provided in correspondence to the column of memory cells MCL and a bit line precharge/equalization circuit BEQL is provided for bit line pair BLL and /BLL. Bit line precharge/equalization circuit BEQL is activated in response to equalization instruction signal EQL, and precharges and equalize bit lines BLL and /BLL at bit line precharge voltage VBL level when active. Since memory cell MCL and bit line precharge/equalization circuit BEQL are equal in configuration to memory cell MCR and bit line precharge/equalization circuit BEQR, respectively, they are be indicated simply by blocks in FIG. 4. Memory cell MCL is connected to a word line WLL. Similarly to memory block MBKR, word line WLL is connected to the access transistors of the memory cells arranged in one row in memory block MBKL.

Bit line isolation circuit BIGL includes a bit line isolation gate BTGL which is made conductive in response to bit line isolation instruction signal BLIL to electrically connect bit lines BLL and /BLL to common bit lines CBL and /CBL, respectively. Bit line isolation gate BTGL includes transfer gates TX provided in correspondence to respective bit lines BLL and /BLL. Transfer gate TX is formed of an N-channel MIS transistor. Bit line isolation instruction signal BLIL is driven to high voltage VPP level when bit line isolation gate BTGL is made conductive so as to prevent the voltage level of H (logical high) data stored in memory cell MCL from lowering due to the threshold voltage loss across transfer gate TX.

Bit line isolation circuit BIGR includes a bit line isolation gate BTGR which is selectively made conductive in response to bit line isolation instruction signal BLIR to electrically connect bit lines BLL and /BLL to common bit lines CBR and /CBR, respectively. Bit line isolation gate BTGR includes transfer gates TX provided in correspondence to respective bit lines BLR and /BLR. Therefore, bit line isolation instruction signal BLIR is also driven to high voltage VPP level when bit line isolation gate BTGR is made conductive.

Sense amplifier band SAB includes a sense amplifier SA which differentially amplifies and latches the potentials of common bit lines CBL and /CBL when activated, a sense activation transistor PQ3 which transmits an array power supply voltage VddS to a P-sense common source node S2P in accordance with sense amplifier activation signal ZS0P, an N-channel MIS transistor NQ3 which transmits precharge voltage VBL to P-sense common source node S2P when sense equalization instruction signal EQ is activated, an N-channel MIS transistor NQ4 which is made conductive, when sense amplifier activation signal S0N is activated, to transmit a ground voltage to an N-sense common source node S2N, and an N-channel MIS transistor NQ5 which is made conductive, when sense equalization instruction signal EQ is activated, to transmit precharge voltage VBL to N-sense common source node S2N.

MIS transistors PQ3 and NQ4 and equalization transistors NQ3 and NQ5 are provided for each predetermined number of sense amplifiers SA. Namely, a predetermined number of sense amplifiers SA are connected to sense common source nodes S2P and S2N. Alternatively, sense common source nodes S2N and S2P may be arranged to all of sense amplifiers SA included in sense amplifier band SAB in common or may be arranged for each sense amplifier SA.

Sense amplifier SA includes a P-channel MIS transistor PQ1 which is connected between common bit line CBL and P-sense common source node S2P and has a gate connected to common bit line /CBL, a P-channel MIS transistor PQ2 which is connected between common bit line /CBL and P-sense common source node S2P and has a gate connected to common bit line CBL, an N-channel MIS transistor NQ1 which is connected between sense common bit line /CBL and N-sense common source node S2N and has a gate connected to common bit line CBL, and an N-channel MIS transistor NQ2 which is connected between common bit line CBL and N-sense common source node S2N and has a gate connected to common bit line /CBL.

P-channel MIS transistors PQ1 and PQ2 drive a higher potential common bit line out of common bit lines /CBL and CBL to array power supply voltage VddS level. N-channel MIS transistors NQ1 and NQ2 drive a lower potential common bit line out of common bit lines CBL and /CBL to ground voltage level.

With the configuration shown in FIG. 4, word lines WLL and WLR are maintained at negative voltage level of, for example, −0.5 V when unselected. By maintaining the gate of access transistor MT of each memory cell at negative voltage level, the gate to source of access transistor MT is set in a deep reverse bias state, and a leakage current from storage node SN of the memory cell to the corresponding bit line is decreased, thereby improving data retention characteristics. In addition, by driving the selected word line to high voltage VPP level, it is possible to transmit the voltage at array power supply voltage VddS level driven by sense amplifier SA to storage node SN without the loss by the threshold voltage of access transistor MT.

A state where a high-resistive short circuit RZ exists between word line WLR and bit line BLR will now be considered. In a standby state, bit line precharge/equalization circuit BEQL is active and bit line BLR is precharged and equalized at bit line precharge voltage VBL level. Word line WLR is in an unselected state and the voltage thereof is, for example, −0.5 V. Bit line precharge voltage VBL is, for example, 0.8 V. In this case, array power supply voltage VddS is 1.6 V and equalization instruction signal EQ is set at peripheral power supply voltage level of 1.6 V. With such a voltage configuration, high voltage VPP is normally approximately 2.9 V.

A case where bit line isolation gate BTGR is maintained in a conductive state in accordance with bit line isolation instruction signal BLIR at high voltage VPP level in the standby state will be considered. In this state, in bit line precharge/equalization circuit BEQR, when precharge voltage VBL is transmitted to bit line BLR through MIS transistor NQ7, a leakage current Ir flows to word line WLR at negative voltage level through high resistance RZ. When the voltage level of bit line BLR lowers, the voltage drop of bit line BLR is transmitted to bit line /BLR through equalization transistor NQ6, whereby the voltage level of bit line /BLR lowers and a current flows from precharge transistor NQ8 to bit line /BLR, accordingly. When word line WLR in the standby state is at negative voltage VBB level particularly, a voltage applied across high resistance RZ is VBL-VBB and leakage current Ir increases. When bit line precharge/equalization circuit BEQR cannot compensate for leakage current Ir, the voltage drop of bit lines BLR and /BLR increases. In the worst case, the voltage levels of bit lines BLR and /BLR lowers to negative voltage VBB level.

If a bit line voltage lowers or word line WLR cannot be driven to a selected state because of high resistance RZ and memory cell data cannot be accurately read, then the defective row and/or the defective column of the memory cells is replaced by a redundant row and/or a redundant column, thereby repairing word line WLR and/or bit line pair BLR, /BLR corresponding to the short circuit. In this case, even in the case where the defective row and/or the defective column is repaired, a path through which the leakage current flows exists because of the presence of high resistance RZ (the semiconductor memory device is treated as a good product when the specification values of current consumption such as a standby current are satisfied).

In addition, in sense amplifier SA, P-sense common sense node S2P is at precharge voltage VBL level. When the voltage level of bit line BLR becomes lower than the precharge voltage level and the voltage level of common bit line CBL lowers, accordingly, then the voltage levels of bit line /BLR and common bit line /CBL are lowered by equalization transistor NQ6, MIS transistor PQ2 is made conductive and a current flows from P-sense common sense node S2P to bit line BLR.

Furthermore, when the voltage level of bit line BLR is not so significantly lowered and, therefore, data can be accurately read from the memory cells connected to bit line BLR, a sub-threshold current (off-leakage current) flows in MIS transistor PQ2 of sense amplifier SA even with the gate to source voltage of MIS transistor PQ2 being not greater than the absolute value of the threshold voltage thereof. In this case, a leakage current also flows in bit line precharge/equalization circuit BEQR. Such a leakage current becomes innegligible particularly in a data holding mode in which low current consumption is required.

This leakage current can be decreased by reducing the size of each transistor as for the bit line precharge/equalization circuit for the following reason. During the precharge/equalization operation of the bit line, equalizing transistor NQ6 short-circuits the bit line at the power supply voltage level and the bit line at the ground voltage level with each other. Therefore, a large precharge current supplying capability is not required for the bit line precharge/equalization circuit (BEQR).

However, in sense amplifier SA, sense common source nodes S2P and S2N are driven to the power supply voltage level and the ground voltage level, respectively, and the voltages on nodes S2P and S2N are driven to precharge voltage VBL at high speed. Therefore, sense node equalizing transistors NQ3 and NQ5 cannot be reduced in size. Particularly, because a plurality of sense amplifiers are connected to sense common source nodes S2P and S2N, sense node equalizing transistors NQ3 and NQ5 cannot be reduced in size.

Accordingly, when high resistance RZ exists due to the short circuit and bit line isolation gate BTGR is set conductive in the standby state, current consumption in this standby state cannot be reduced by leakage current Ir.

Even in the case where the short circuit between the word line and the bit line exists in any memory block, if all the memory blocks are connected to the corresponding sense amplifier bands as in the conventional art, current consumption cannot be reduced because leakage currents flow from a corresponding sense amplifier band through the short circuit.

This current consumption is increased by the leakage current on short circuit portion, regardless of whether a short-circuit defect is repaired by redundancy replacement (the specification value of the current consumption is satisfied) or no short-circuit defect occurs even if the short circuit exists.

In this standby state, particularly in the standby state in a self refresh mode set in the data holding mode, bit line isolation gate BTGR is set to an off state, making it possible to prevent a current from flowing from sense amplifier SA to high resistance RZ through common bit line CBL. By reducing transistors NQ6 to NQ8 in size (making the ratio of a channel width to a channel length of each transistor smaller), it is possible to decrease the leakage current in bit line precharge/equalization circuit BEQR.

Even in the case where sense node precharging transistors NQ3 and NQ5 of sense amplifier SA cannot be reduced in size, it is possible to shut off the path through which a leakage current I from sense amplifier SA flows and to reduce the current consumption in the standby state by maintaining bit line isolation gates BTGL and BTGR to be in an off state in the standby state, particularly in the standby state in the self refresh mode set in the data holding mode.

Bit line isolation control in the first embodiment will be described specifically. As for the short circuit between a bit line and a word line, as long as this semiconductor memory device operates normally, either of the cases will apply where redundant replacement is performed on the corresponding word line and/or bit line, or where the corresponding word line and bit line normally transmit signals/data and no redundant replacement is performed. However, in the following description, a case where the short circuit between a word line and a bit line is a high resistance to cause only a minute leakage current flow and the word line and the bit line are normally driven will be considered for simplifying the description. In other words, a state where the short circuit between the word line and the bit line adversely influences only on current consumption and does not influences at all on memory cell data sensing operation will be considered.

Figure 5:
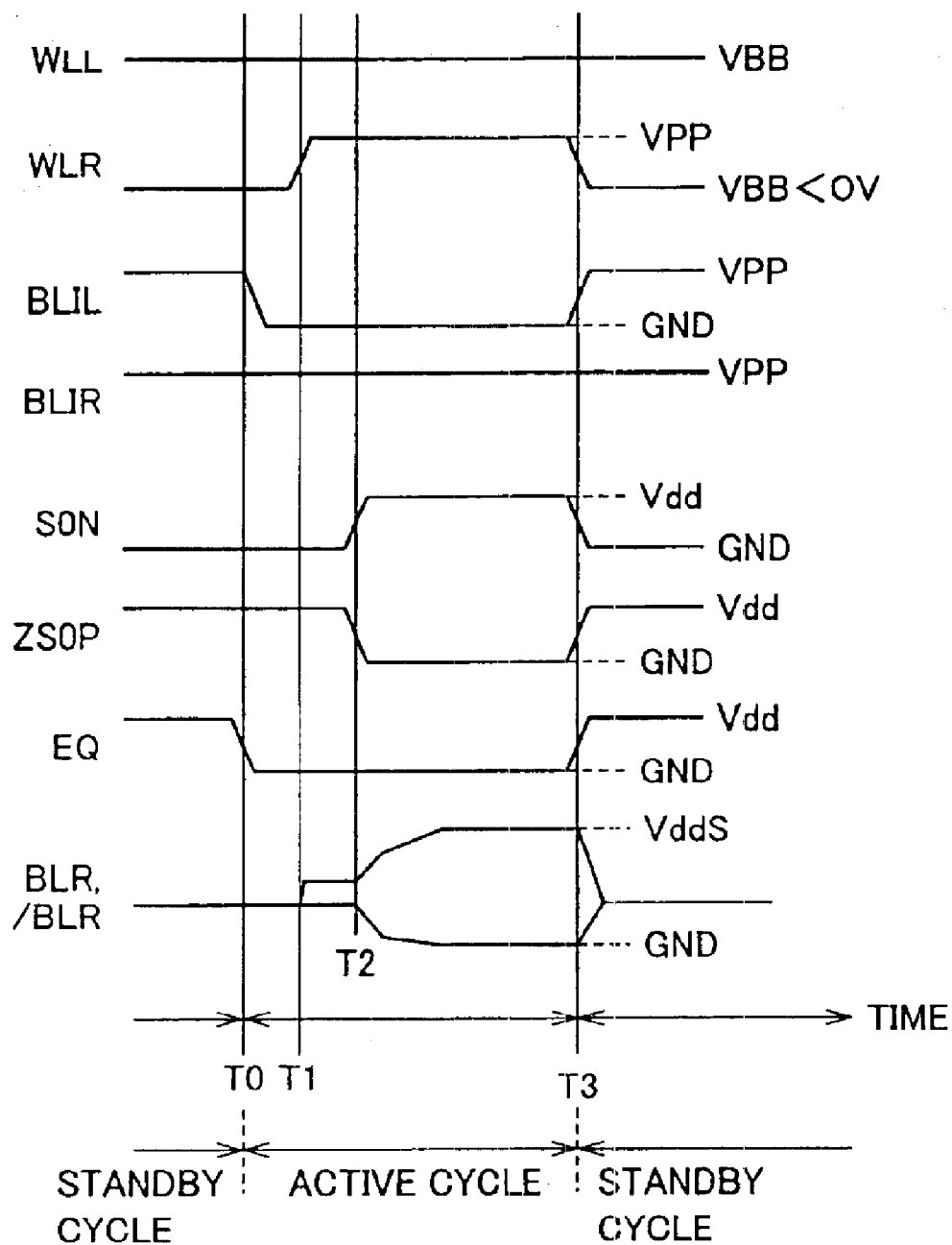
FIG. 5 is a signal waveform diagram representing an operation of the configuration shown in FIG. 4.

FIG. 5 is a timing chart representing the operations of the construction shown in FIG. 4 in a normal operation mode. Referring to FIG. 5, a sensing operation for sensing data in memory cell MCR in the construction shown in FIG. 4 will be described.

In a standby cycle, word lines WLL and WLR are both at negative voltage VBB level. Bit line equalization instruction signals EQL and EQR are both at H level, and bit lines BLL, /BLL and BLR, /BLR are all precharged at intermediate voltage VBL level. In FIG. 5, only the voltage waveforms of bit lines BLR and /BLR are shown. Further, sense amplifier activation signal S0N is at ground voltage GND level, and sense amplifier activation signal ZS0P is at sense (array) power supply voltage Vdd level. Therefore, sense common source lines S2N and S2P are precharged at intermediate voltage VBL level by equalizing transistors NQ3 and NQ5.

At time T0, an active cycle starts and a memory cell row select operation is carried out. In this case, a memory block including a selected memory cell is first selected in accordance with an address signal. In this example, memory cell MCR shown in FIG. 4 is selected. The level of sense equalization instruction signal EQ is lowered to L level (ground voltage level) in accordance with the deactivation of bit line equalization instruction signal EQR. Further, the level of bit line isolation instruction signal BLIL falls from high voltage VPP level to ground voltage GND level, so that bit line isolation gate BTGL is made nonconductive. Accordingly, common bit lines CBL and /CBL are isolated from bit lines BLL and /BLL, respectively. In this state, bit line precharge/equalization circuit BEQL is active in accordance with bit line equalization instruction signal EQL.

Bit line isolation instruction signal BLIR is maintained at high voltage VPP level similarly to the standby cycle, and bit line isolation gate BTGR is maintained conductive. Therefore, similarly to the standby cycle, bit lines BLR and /BLR are connected to common bit lines CBL and /CBL, respectively.

At time T1, word line WLR is selected and the voltage level of word line WLR is driven from negative voltage VBB level to high voltage VPP level. Accordingly, access transistor MT in memory cell MCR is made conductive, and the charges accumulated in storage node SN are transmitted to bit line BLR. In FIG. 5, the signal waveforms of bit lines BLR and /BLR in the case when H data is read to bit line BLR are shown. Bit line /BLR is maintained at precharge voltage VBL level.

When the voltage difference between bit lines BLR and /BLR is sufficiently developed, N-sense amplifier activation signal S0N is driven to H level (peripheral power supply voltage Vdd level) and P-sense amplifier activation signal ZS0P is driven to ground voltage GND level. Accordingly, sense common source nodes S2N and S2P are driven to ground voltage GND level and sense power supply voltage VddS level by MIS transistors NQ4 and PQ3, respectively, and sense amplifier SA is activated to amplify the voltage difference between common bit lines CBL and /CBL.

Further, sense amplifier SA also drives bit lines BLR and /BLR through bit line isolation gate BTGR to sense power supply voltage VddS level and ground voltage GND level, respectively. According to this bit line driving, H data at sense power supply voltage VddS level is rewritten to storage node SN of memory cell MCR. Thereafter, a column select operation is performed through a path, not shown, and the data latched by sense amplifier SA is read (in a data read mode).

After the active cycle of accessing the memory cell data is completed, the internal state in the construction shown in FIG. 4 returns to a precharge state at time T3. That is, word line WLR in the selected state is driven again to negative voltage VBB level, and sense amplifier activation signals S0N and ZS0P are driven to ground voltage GND level and peripheral power supply voltage Vdd level, respectively. Next, the level of bit line isolation instruction signal BLIL is driven again to high voltage VPP level to turn bit line isolation gate BTGL conductive again. In addition, in accordance with the activation of bit line equalization instruction signal EQR, sense equalization instruction signal EQ is activated. Bit lines BLR and /BLR are precharged and equalized again at the original intermediate voltage level.

In FIG. 5, the precharge voltage level of bit lines BLR and /BLR is shown being lower than the intermediate voltage level between array power supply voltage VddS and ground voltage GND. This is intended to emphasize that the precharge/equalization voltage level is slightly lower than intermediate voltage VBL level due to the leakage current caused by high resistance RZ. Even in the case where leakage current Ir flows through high resistance RZ, it is possible to accurately perform the sensing operation and sense and amplify memory cell data, as long as such a voltage difference to be able to be sensed by sense amplifier SA is generated between bit lines BLR and /BLR.

Further, as described above, leakage current Ir is a minute current and within the allowable range on the specification. In order to indicate that leakage current Ir is a minute current, the short circuit between the word line and the bit line is denoted by high resistance RZ.

In the standby state, common bit lines CBL and /CBL are connected to bit lines BLL, BLR and /BLL, /BLR through bit line isolation gates BTGL and BTGR, respectively. Therefore, sense common bit lines CBL and /CBL are ensured to be precharged and equalized, thus ensuring an accurate sensing operation.

Figure 6:
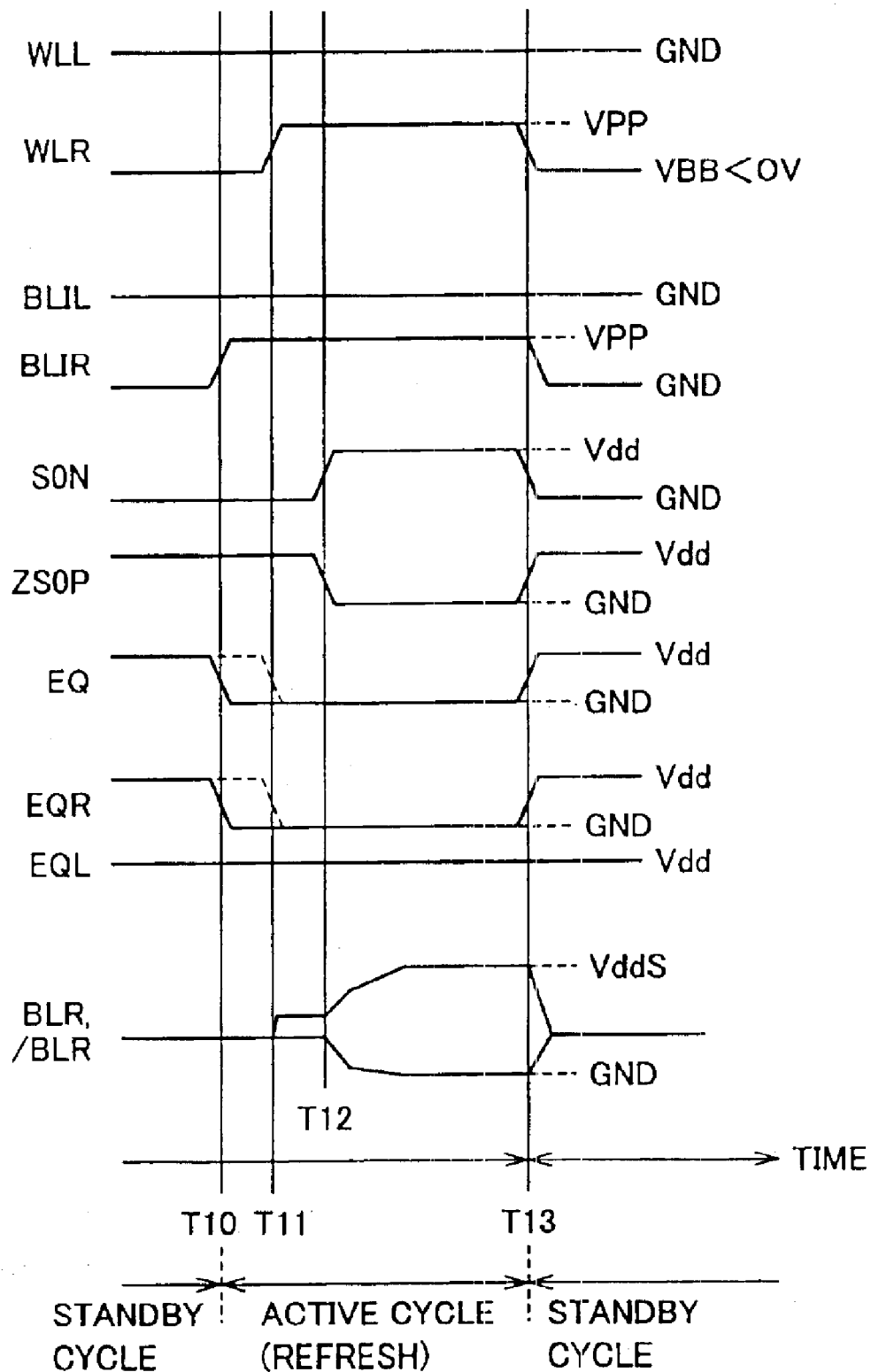
FIG. 6 is a signal waveform diagram representing an operation of the semiconductor memory device shown in FIG. 4 in a self refresh mode.

FIG. 6 is a timing chart representing the operation of the sense amplifier shown in FIG. 4 in a self refresh mode. Referring to FIG. 6, the operation of sense amplifier band SAB shown in FIG. 4 in the self refresh mode will be described.

This self refresh mode is set when data access is not performed for a long time and only the holding of the stored data is requested. In the self refresh mode, bit line isolation instruction signals BLIL and BLIR are maintained at ground voltage GND level and, therefore, bit line isolation gates BTGR and BTGLL are kept nonconductive, and common bit lines CBL and /CBL are isolated from bit lines BLR, BLL and /BLR, /BLL, respectively, in the standby cycle (state). Bit line equalization instruction signals EQR and EQL are at peripheral power supply voltage Vdd level, bit line precharge/equalization circuits BEQL and BEQR are active, and bit lines BLR, /BLR and BLL, /BLL are precharged and equalized at the predetermined voltage level.

Likewise, in sense amplifier SA, sense equalization instruction signal EQ is at H level, and sense common source nodes S2P and S2N are precharged at precharge voltage VBL level. Since sense amplifier SA is isolated from bit lines BLR and /BLR, the path of causing a current flow from sense common source node S2P to high resistance RZ is shut off, thus reducing current consumption in the standby state in the self refresh mode.

Common bit lines CBL and /CBL are in an electrically floating state. Now, a state where noise is generated on common bit lines CBL and /CBL and the voltage levels of common bit lines CBL and /CBL change will be considered. For example, when the voltage level of common bit line CBL becomes higher than precharge voltage VBL level due to the noise to generate the voltage difference which is not less than the absolute value of the threshold voltage of MIS transistor PQ2 between bit lines CBL and /CBL, then MIS transistor PQ2 turns conductive and the rise of the voltage level of common bit line CBL is suppressed. At this time, even if MIS transistor NQ1 is made conductive, common bit line /CBL is only precharged at precharge voltage VBL level.

On the other hand, when the voltage level of common bit line CBL lowers due to the influence of the noise or the like and the voltage difference which is not less than the threshold voltage of MIS transistor NQ2 is generated between bit lines CBL and /CBL, MIS transistor NQ2 is made conductive and the fall of the potential of common bit line CBL is suppressed. Even in the case where the voltage difference which is not greater than the absolute value of the threshold voltage of the sense amplifier transistors is generated between common bit lines CBL and /CBL, the voltage difference is decreased by the leakage current of the transistors in sense amplifier SA. Therefore, even if common bit lines CBL and /CBL are maintained in the electrically floating state by bit line isolation gates BTGL and BTGR, it is possible to sufficiently suppress the voltage change of common bit lines CBL and /CBL and to maintain the bit lines substantially at constant precharge voltage VBL level.

When a refresh request is issued, a refresh activation signal, not shown, is activated and a refresh operation is performed at time T10. Now, a case where word line WLR is designated by a refresh address in the refresh operation will be considered. In this case, the level of bit line isolation instruction signal BLIR is driven to high voltage VPP level. Bit line isolation instruction signal BLIL is maintained at ground voltage GND level. Bit line equalization instruction signal EQR is driven to ground voltage GND level. Bit line equalization instruction signal EQL is maintained at H level. In accordance with the deactivation of bit line equalization instruction signal EQR, sense equalization instruction signal EQ is also deactivated.

When bit line isolation instruction signal BLIR is driven to high voltage VPP level, bit lines BLR and /BLR are coupled to common bit lines CBL and /CBL, respectively. The parasitic capacitances of bit lines BLR and /BLR are greater than those of respective common bit lines CBL and /CBL. Therefore, even if the levels of common bit lines CBL and /CBL change from predetermined precharge voltage VBL level in the standby state, they are driven to the original precharge voltage level by the precharge voltages of bit lines BLR and /BLR, respectively.

At time T11, word line WLR is driven to be selected and a voltage difference is generated between bit lines BLR and /BLR. The voltage difference between bit lines BLR and /BLR is transmitted to common bit lines CBL and /CBL.

When the voltage difference between bit lines BLR and /BLR is sufficiently developed, then sense amplifier activation signals S0N and ZS0P are activated, sense common source nodes S2N and S2P are driven to ground voltage GND level and array power supply voltage VddS level, respectively and sense amplifier SA is activated at time T12. Accordingly, the voltage difference between bit lines BLR and /BLR is amplified and bit lines BLR and /BLR are driven to array power supply voltage VddS level and ground voltage GND level, respectively.

In FIG. 6 also, the voltage waveforms of the bit lines in the case when H-level data is stored in memory cell MCR are shown. The array power supply voltage of bit line BLR is written to memory cell MCR and the data stored in memory cell MCR is refreshed.

In each column of the memory block, bit line voltage VddS or ground voltage GND amplified by sense amplifier SA is stored to the corresponding memory cells and the stored data is refreshed.

At time T13, the refresh operation is completed, and the level of selected word line WLR is driven to negative voltage VBB level and WLR is driven into an unselected state. In addition, sense amplifier activation signals S0N and ZS2P are deactivated and sense amplifier SA is deactivated. Further, bit line isolation instruction signal BLIR is set at ground voltage GND level, bit line isolation gate BTGR is made nonconductive, bit line equalization instruction signal EQR is driven to peripheral power supply voltage Vdd level, and bit lines BLR and /BLR are driven to the original precharge voltage level by bit line precharge/equalization circuit BEQR.

Therefore, by setting bit line isolation gates BTGL and BTGR to be nonconductive in the standby state in the data holding mode in which low current consumption is required, it is possible to isolate equalization transistors NQ3 and NQ5 of sense amplifier SA from high resistance RZ, to prevent the leakage current from flowing from the sense amplifier circuit to unselected word line through the high resistance in the standby state, and to thus sufficiently suppress current consumption.

As indicated by broken lines in FIG. 6, bit line equalization instruction signal EQR and sense equalization instruction signal EQ may be driven to a deactivate state before word line WLR is selected. In addition, when the active cycle is completed in the refresh operation, bit line isolation control signal BLIR may be driven to ground voltage GND level after activation of the equalization operation. With this configuration, it is possible to ensure precharging the sense nodes of sense amplifier SA, i.e., common bit lines CBL and /CBL at the intermediate voltage level when the refresh operation starts, and to ensure driving common bit lines CBL and /CBL to the precharge voltage level upon transition to the standby state.

Figure 7:
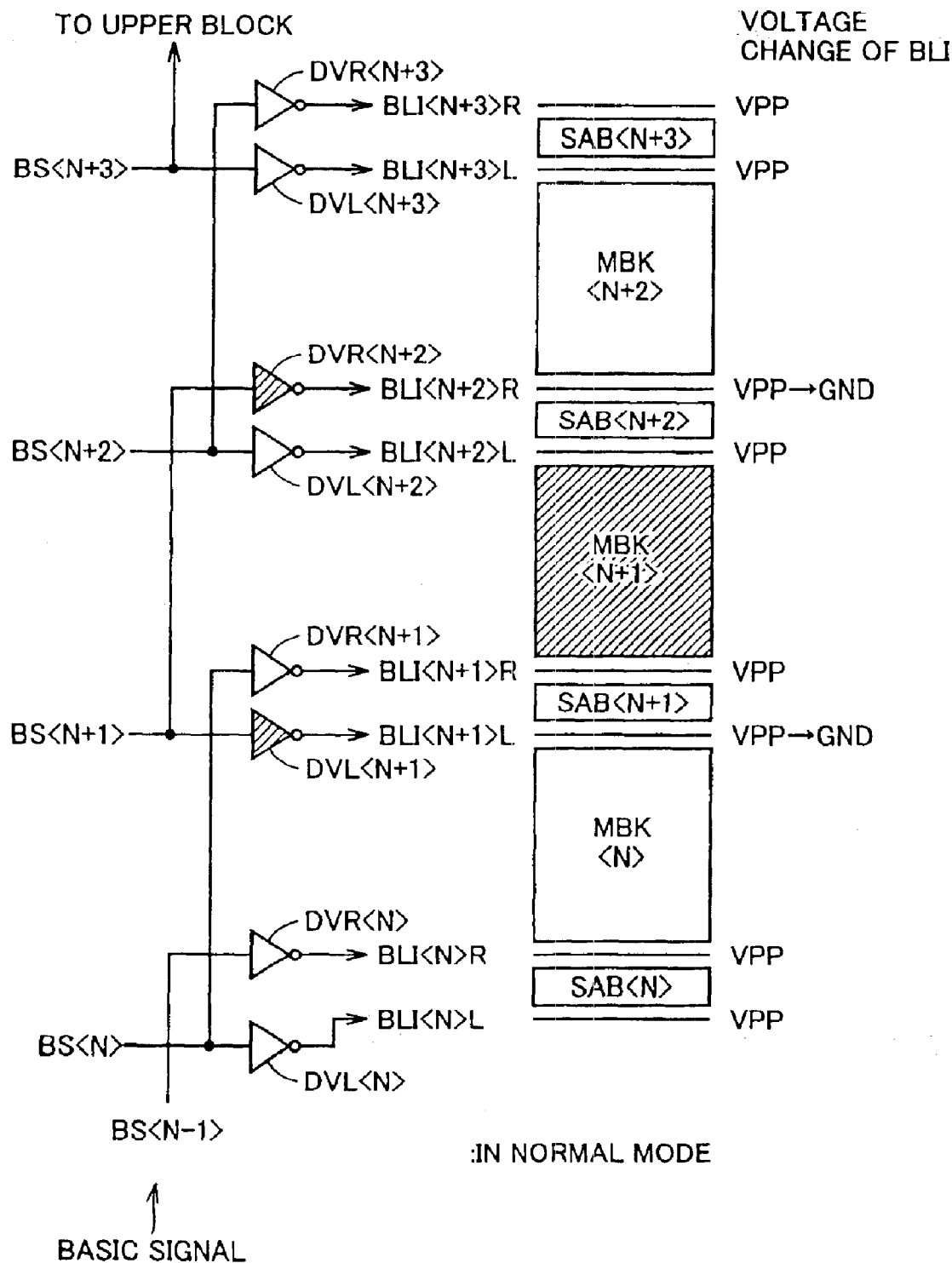
FIG. 7 conceptually shows the correspondence between a memory block select signal and a bit line isolation instruction signal according to the first embodiment of the present invention.

FIG. 7 conceptually shows the correspondence between the bit line isolation instruction signals and the memory block select signals in a normal operation mode. In FIG. 7, bit line isolation instruction signals BLI<N>L, BLI<N>R to BLI<N+3>L, BLI<N+3>R for memory blocks MBK<N> to MBK<N+2>, respectively are shown. The bit line isolation circuit is not shown in FIG. 7 in order to simplify illustration.

A sense amplifier band SAB<N> is shared between a memory block MBK<N−1>, not shown, and memory block MBK<N>. A sense amplifier band SAB<N+1> is shared between memory blocks MBK<N+1> and MBK<N>. A sense amplifier band SAB<N+2> is shared between memory blocks MBK<N+2> and MBK<N+1>. A sense amplifier band SAB<N+3> is shared between memory block MBK<N+2> and a memory block MBK<N+3>, not shown. Namely, in the configuration of the sense amplifier bands, the sense amplifiers are alternately arranged on both sides of the bit line pairs of the corresponding memory blocks and arranged into a so-called alternate arrangement shared sense amplifier configuration.

Sense amplifier band SAB<N+3> is selectively connected to memory blocks MBK<N+3> and MBK<N+2> in accordance with bit line isolation instruction signals BLI<N+3>R and BLI<N+3>L. Sense amplifier band SAB<N+2> is selectively connected to memory blocks MBK<N+2> and MBK<N+1> in accordance with bit line isolation instruction signals BLI<N+2>R and BLI<N+2>L.

Sense amplifier band SAB<N+1> is selectively connected to memory blocks MBK<N+1> and MBK<N> in accordance with bit line isolation instruction signals BLI<N+1>R and BLI<N+1>L. Sense amplifier band SAB<N> is selectively connected to memory blocks MBK<N> and MBK<N−1>, not shown, in accordance with bit line isolation instruction signals BLI<N>R and BLI<N>L.

Bit line isolation instruction signals BLI<N>R to BLI<N+3>R are driven by drive circuits DVR<N> to DVR<N+3>, respectively. Bit line isolation instruction signals BLI<N>L to BLI<N+3>L are driven by drive circuits DVL<N> to DVL<N+3>, respectively.

In a normal mode in which data access is made, drive circuit DVR<N> is supplied with a signal generated based on block select signal BS<N−1>. Each of drive circuits DVL<N> and DVR<N+1> is supplied with a signal generated based on block select signal BS<N>.

Each of drive circuits DVL<N+1> and DVR<N+2> is supplied with a signal generated based on block select signal BS<N+1>. Each of drive circuits DVL<N+2> and DVR<N+3> is supplied with a signal generated based on block select signal BS<N+2>. Drive circuit DVL<N+3> is supplied with a signal generated based on block select signal BS<N+2>. In FIG. 7, in order to consider the correspondence between the selected memory block and the state of the bit line isolation control signal, block select signals BS<N−1> to BS<N+3> are shown being applied to corresponding drive circuits DVL<N+3;N> and DVR<N+3;N>.

A case where memory block MBK<N+1> is selected will be considered. In this case, memory block select signal BS<N+1> is driven into a selected state. Remaining memory block select signals BS<N>, BS<N+2> and BS<N+3> are set unselected. Each of drive circuits DVL<N>, DVR<N> to DVL<N+3>, DVR<N+3> is formed of an inverter circuit. Therefore, bit line isolation instruction signals BLI<N+2>R and BLI<N+1>L outputted from drive circuits DVL<N+1> and DVR<N+2>, respectively are driven to ground voltage GND level. The other bit line isolation instruction signals are maintained at high voltage VPP level. Accordingly, sense amplifier band SAB<N+1> is isolated from memory block MBK<N> and sense amplifier band SAB<N+2> is isolated from memory block MBK<N+2>. The other bit line isolation instruction signals are maintained at high voltage VPP level.

Figure 8:
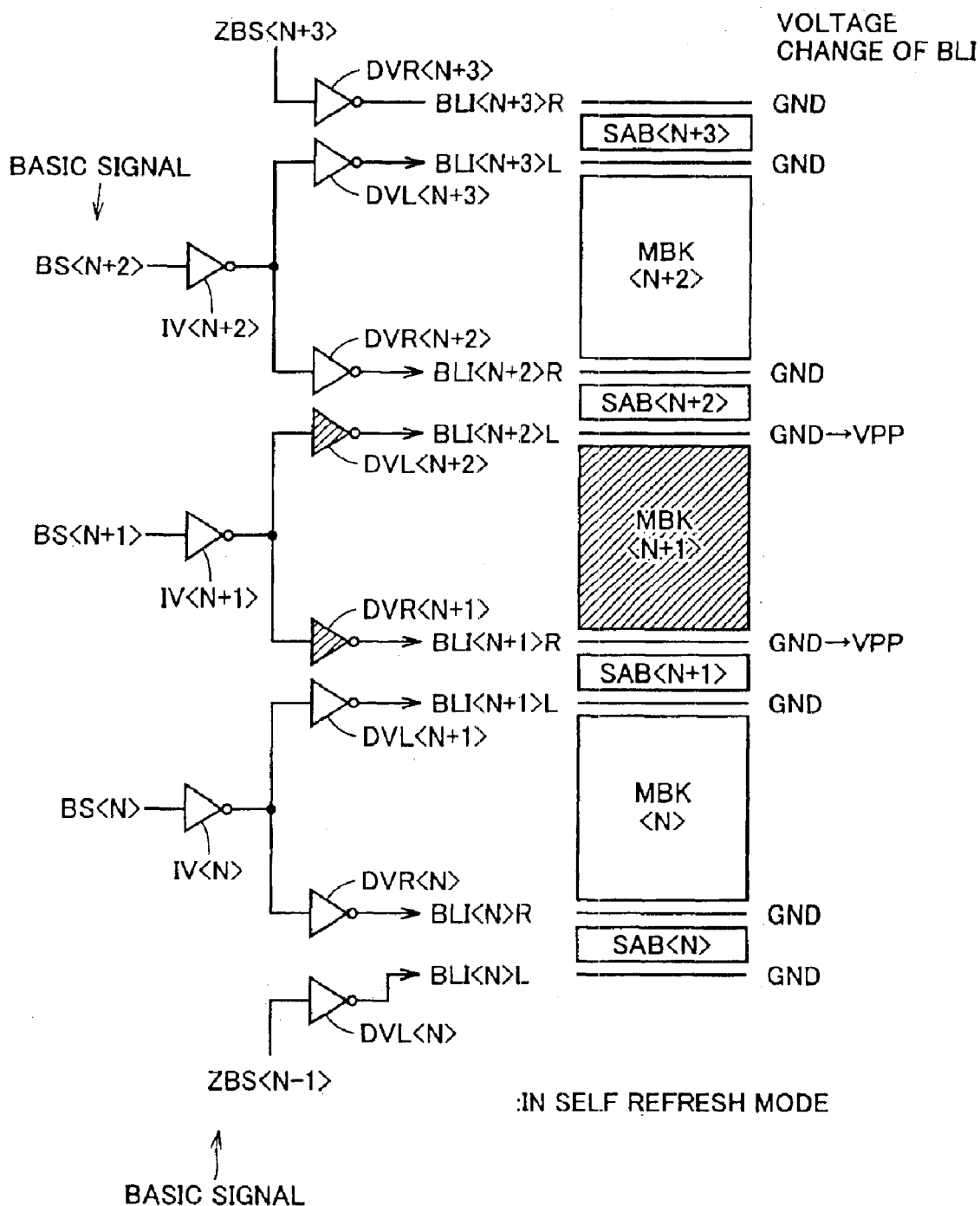
FIG. 8 conceptually shows the correspondence between the memory block select signal and the bit line isolation instruction signal in a self refresh mode according to the first embodiment of the present invention.

FIG. 8 conceptually shows the correspondence between the bit line isolation instruction signals and block select signals in a self refresh mode. The memory blocks and the drive circuits are identical in configuration to those shown in FIG. 7. In FIG. 8 as well, the bit line isolation circuits are indicated by the corresponding bit line isolation instruction signals, respectively. Each bit line isolation instruction signal is generated using the signal generated based on the memory block select signal as a trigger. In FIG. 8, in order to show the correspondence between the selected memory block and the bit line isolation instruction signal, each bit line isolation instruction signal is shown being generated from the memory block select signal.

In the self refresh mode shown in FIG. 8, inverter circuits IV<N> to IV<N+2> which invert signals generated based on he block select signals are provided for block select signals BS<N> to BS<N+2>, respectively. Therefore, in the self refresh mode, the logic between block select signals BS<N> and BS<N+2> and bit line isolation instruction signals BLI<N>L, BLI<N>R and BLI<N>R, BLI<N+2>R is inverted from that in the normal operation mode.

The output signal of inverter circuit IV<N> is applied to each of drive circuits DVR<N> and DVL<N+1>. The output signal of inverter circuit IV<N+1> is applied to each of drive circuits DVR<N+1> and DVL<N+2>. The output signal of inverter circuit IV<N+2> is applied to each of drive circuits DVR<N+2> and DVL<N+3>. A signal generated based on an inverted signal ZBS<N−1> of the block select signal is applied to drive circuit DVL<N>. A signal generated based on an inverted signal ZBS<N+3> of block select signal BS<N+3> is applied to drive circuit DVR<N+3>.

With the configuration shown in FIG. 8, all of memory block select signals BS<N> to BS<N+2> are in an unselected state in the standby state, and inverted memory block select signals ZBS<N−1> and ZBS<N+3> are, therefore, at H level in the standby state. Accordingly, all of bit line isolation instruction signals BLI<N>L, BLI<N>R to BLI<N+3>L, BLI<N+3>R outputted from respective drive circuits DVL<N>, DVR<N> to DVL<N>, DVR<N+3> are at ground voltage GND level.

A state where memory block MBK<N+1> is selected in the self refresh mode will be considered. In this case, memory block select signal BS<N+1> is driven to be selected. Therefore, bit line isolation instruction signals BLI<N+1>R and BLI<N+2>L from drive circuits DVL<N+1> and DVR<N+2> are driven from ground voltage GND level to high voltage VPP level. The remaining bit line isolation instruction signals are maintained at ground voltage GND level since the corresponding memory block select signals are unselected.

Therefore, it is possible to connect only selected memory block MBK<N+1> to sense amplifier bands SAB<N+1> and SAB<N+2> and to isolate other memory blocks MBK<N> and MBK<N+2> from corresponding sense amplifier bands. In each of memory blocks MBK<N> and MBK<N+2>, the bit line precharge/equalization circuit performs a bit line precharge/equalization operation.

In other words, in the self refresh mode, all the memory blocks in the standby state are isolated from the corresponding sense amplifier bands and only the selected memory block is connected to the corresponding sense amplifier bands. Even in the case where a short-circuit defect exists, it is possible to decrease a standby current since sense amplifier band and the short circuit of high resistance are isolated in the standby state.

Figure 9:
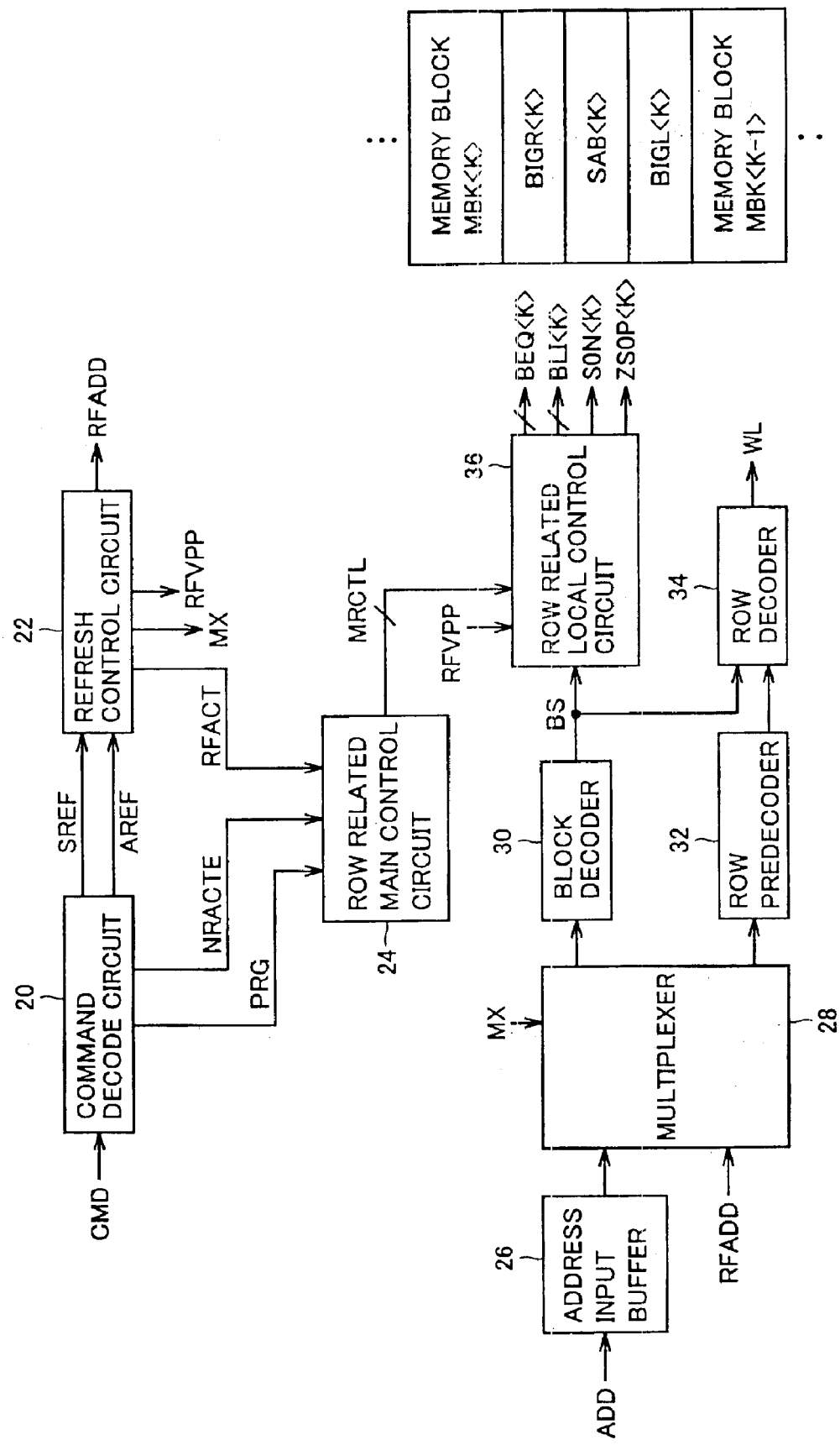
FIG. 9 is a schematic diagram showing a configuration of a row related control circuit and a row related circuit according to the first embodiment of the present invention.

FIG. 9 is a schematic diagram showing the configuration of a row related control signal generation section according to the first embodiment of the present invention. In FIG. 9, the row related control signal generation section includes a command decode circuit 20 which decodes an external command CMD and generates an internal operation mode instruction signal, and a refresh control circuit 22 which generates control signals necessary for refresh in accordance with a self refresh mode instruction signal SREF and an auto refresh mode instruction signal AREF from command decode circuit 20.

Command decode circuit 20 incorporates and decodes command CMD applied externally at, for example, the rising edge of a clock signal. Command decode circuit 20 activates a normal row access instruction signal NRACTE when command CMD designates a row select operation, and activates a precharge instruction signal PRG when command CMD specifies the completion of the row select operation. In addition, command decode circuit 20 activates self refresh mode instruction signal SREF when command CMD designates a self refresh mode, and activates auto refresh mode instruction signal AREF when command CMD designates an auto refresh mode.

Command decode circuit 20 may generate a self refresh mode entry instruction signal when command CMD indicates self refresh mode entry, and may generate a self refresh exit signal when command CMD indicates the completion of the self refresh mode. In this case, self refresh mode instruction signal SREF is activated in accordance with the self refresh mode entry instruction signal, and deactivated in accordance with the self refresh mode exit instruction signal.

Refresh control circuit 22 generates a refresh address REFADD and an address switch signal MX for switching the refresh address and an external address when command CMD designates the auto refresh mode or the self refresh mode. Refresh control circuit 22 generates a refresh row activation signal RFACT having a predetermined time width when auto refresh mode instruction signal AREF is activated. When the self refresh mode is designated, refresh control circuit 22 starts an internal timer, activates refresh row activation signal RFACT at predetermined time intervals, and updates refresh address RFADD for each refresh operation. Further, refresh control circuit 22 generates a isolation control switch signal RFVPP at high voltage VPP level so as to converts the logic of the bit line isolation gate between the normal operation mode and the self refresh mode. By generating isolation control switch signal RFVPP in this self refresh mode, the logic of the isolation control circuit that generates the bit line isolation instruction signals is switched.

The row related control signal generation section further includes a row related main control circuit 24 which receives normal row access instruction signal NRACTE, precharge instruction signal PRG and refresh row activation signal RFACT from command decode circuit 20, and generates a main row related control signal group MRCTL. Row related main control circuit 24, which is included in peripheral circuitry 3 shown in FIG. 1, transmits main row related control signal group MRCTL to the row select circuits included in the respective memory mats. The activation/deactivation of each memory mat is determined appropriately in accordance with the configuration of the memory mats. In the bank configuration, the memory mats are activated in units of banks. When the mats are activated in units of mats, the main control signals applied to the selected mat are activated by an address signal for specifying a mat. Any of mat activation scheme can be employed, and therefore, FIG. 9 simply shows that row related main control circuit 24 generates man row related control signal group MRCTL for the corresponding memory mat.

The row related control signal generation circuit further includes a row related local control circuit 36 arranged in correspondence to each sense amplifier band. Row related local control circuit 36 is included in row related control circuit 12 shown in FIG. 2, and generates bit line isolation control signal BLI, sense amplifier activation signals S0N and ZS0P and bit line equalization instruction signal BEQ for the corresponding sense amplifier band and bit line isolation circuits in accordance with block select signal BS from a block decoder 30. In FIG. 9, bit line isolation control signal BLI<K>, sense amplifier activation signals S0N<K> and ZS0N<K>, and bit line equalization instruction signal BEQ<K> for sense amplifier band SAB<K> and bit line isolation circuits BIGR<K> and BIGL<K> are representatively shown. Bit line isolation control signal BLI<K> includes both bit line isolation instruction signal BLIR<K> for bit line isolation circuit BIGR<K> and bit line isolation instruction signal BLIL<K> for bit line isolation circuit BIGL<K>.

Sense amplifier band SAB<K> is shared between memory blocks MBK<K> and MBK<K−1>. Isolation control switch signal RFVPP is applied to row related local control circuit 36 from refresh control circuit 22. In accordance with isolation control switch signal RFVPP, the correspondence relationship between block select signal BS and bit line isolation control signal BLI<K> is switched and the logic thereof is switched.

As circuits related to the row selection, an address input buffer 26 which takes in external address signal ADD and generates an internal address, a multiplexer 28 which selects either the internal address signal from address input buffer 26 or refresh address RFADD in accordance with address switch signal MX from refresh control circuit 22, a block decoder 30 which decodes a block address from multiplexer 28 and generates block select signal BS, and a row predecoder 32 which predecodes an internal row address signal applied from multiplexer 28 and generates a row predecode signal, are provided in common to the respective memory blocks of the corresponding memory mat. A row decoder 34 is provided for each memory block.

Row decoder 34, which is included in row select circuit 10 shown in FIG. 2, is activated to predecode the row predecode signal from row predecoder 32 and to drive an addressed word line WL to a selected state when block select signal BS from block decoder 30 is selected. FIG. 9 shows that row decoder 34 is provided for memory block MBK<K−1>. In this case, when block select signal BS<K−1> is selected, row decoder 34 is activated to drive the word line for the addressed row in memory block MBK<K−1> to the selected state.

Figure 10:
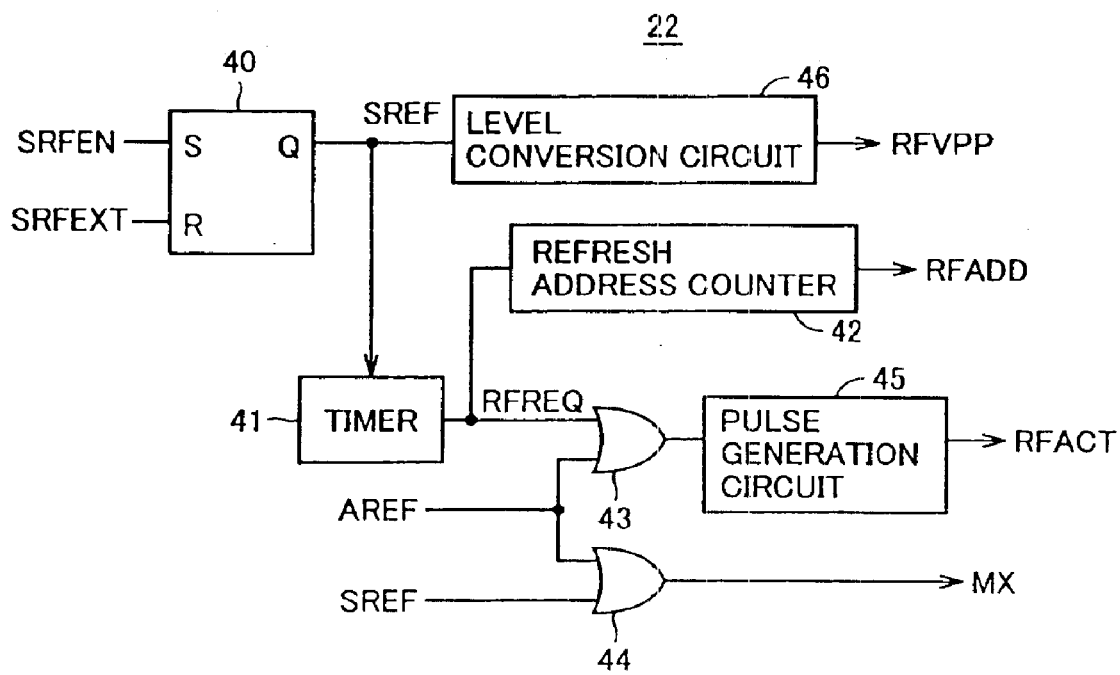
FIG. 10 shows an example of a configuration of a refresh control circuit shown in FIG. 9.

FIG. 10 is a schematic diagram showing an example of the configuration of refresh control circuit 22 shown in FIG. 9. In FIG. 10, refresh control circuit 22 includes a set/reset flip-flop 40 which is set in response to the activation of self refresh entry instruction signal SRFEN and reset in response to self refresh exit instruction signal SRFEXT, a timer 41 which is started in response to self refresh mode instruction signal SREF from an output Q of set/reset flip-flop 40 and issues a refresh request RFREQ at predetermined intervals, a refresh address counter 42 which performs a count operation in accordance with refresh request RFREQ from timer 41 and generates refresh address RFADD, an OR circuit 43 which receives refresh request RFREQ and auto refresh mode instruction signal AREF, a pulse generation circuit 45 which generates a one-shot pulse signal having a predetermined time width in response to the rise of the output signal of OR circuit 43, an OR circuit 44 which receives auto refresh mode instruction signal AREF and self refresh mode instruction signal SREF and generates address switch signal MX, and a level conversion circuit 46 which converts the level of self refresh mode instruction signal SREF and generates isolation control switch signal RFVPP.

Pulse generation circuit 45 generates refresh row activation signal RFACT. Level conversion circuit 46 converts self refresh mode instruction signal SREF at the peripheral power supply voltage level into a signal at high voltage VPP level, to generates isolation control switch signal RFVPP. Level conversion circuit 46 simply converts the voltage level and does not convert the logic level. Therefore, isolation control switch signal RFVPP is set at the high voltage VPP level in the self refresh mode, and set at L level in the normal operation mode and the auto refresh mode.

Figure 11:
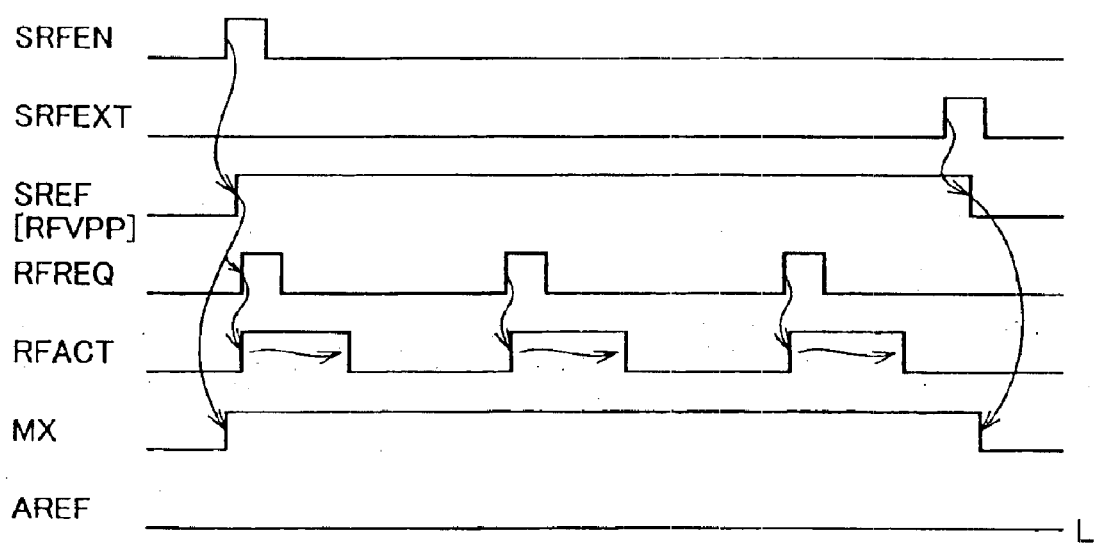
FIG. 11 is a timing chart representing an operation of the refresh control circuit shown in FIG. 10.

Self refresh entry instruction signal SRFEN and self refresh exit instruction signal SRFEXT applied to set/reset flip-flop 40 are applied from command decode circuit 20 shown in FIG. 9. The operation of refresh control circuit 22 shown in FIG. 10 will now be described with reference to the timing chart of FIG. 11.

When self refresh entry instruction signal SRFEN is applied from command decode circuit 20 shown in FIG. 9, set/reset flip-flop 40 is set and self refresh mode instruction signal SREF is set at H level. In response to the activation of self refresh mode instruction signal SREF, timer 41 is started and issues refresh request RFREQ at predetermined intervals. In accordance with refresh request RFREQ, pulse generation circuit 45 generates refresh row activation signal RFACT having a predetermined time width.

Further, in accordance with self refresh mode instruction signal SREF from set/reset flip-flop 40, address switch control signal MX is set at H level and multiplexer 28 shown in FIG. 9 selects refresh address RFADD.

Level conversion circuit 46 sets isolation control switch signal RFVPP at high voltage VPP level in accordance with self refresh mode instruction signal SREF at H level.

In the self refresh mode, therefore, refresh row activation signal RFACT is activated at the intervals of the issuance of refresh request RFREQ, a memory cell row is selected in accordance with refresh address RFADD from refresh address counter 42, and the data in the memory cells in the selected row is refreshed.

Figure 12:
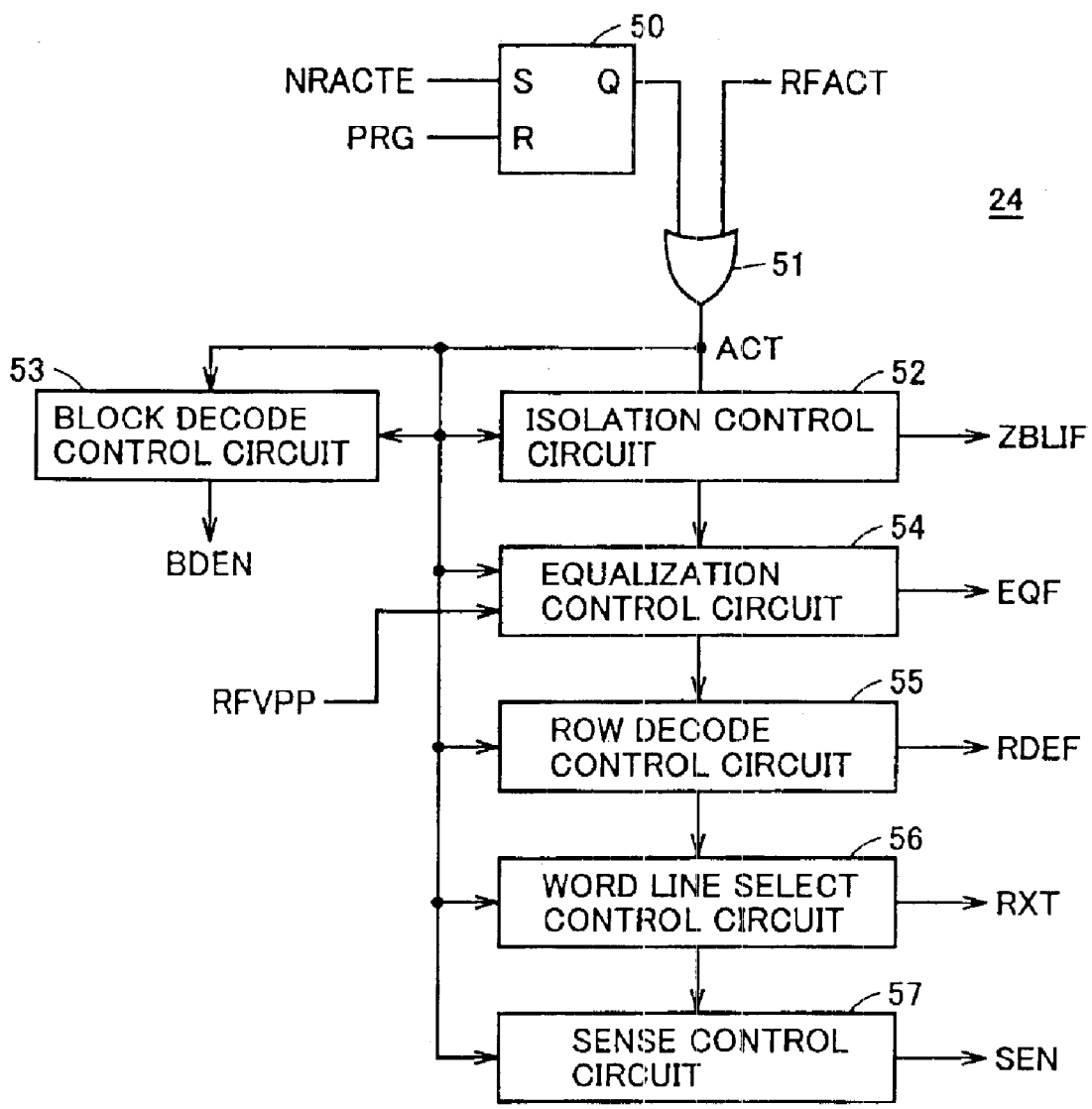
FIG. 12 is a schematic diagram showing a configuration of a row related main control circuit shown in FIG. 9.

FIG. 12 is a schematic diagram showing the configuration of row related main control circuit 24 shown in FIG. 9. In FIG. 12, row related main control circuit 24 includes a set/reset flip-flop 50 which is set in response to the activation of normal row access instruction signal NRACTE and reset in response to the activation of precharge instruction signal PRG, an OR circuit 51 which receives a signal from an output Q of set/reset flip-flop 50 and refresh row activation signal RFACT, a isolation control circuit 52 which generates a main bit line isolation control signal ZBLIF in accordance with a row activation signal ACT from OR circuit 51, a block decode control circuit 53 which generates a block decoder enable signal BDEN in response to row activation signal ACT, an equalization control circuit 54 which generates an equalization control signal EQF in accordance with the output signal of isolation control circuit 52 and isolation control switch signal RFVPP, a row decode control circuit 55 which generates a row decoder enable signal RDEF in accordance with the output signal of equalization control circuit 54, a word line select control circuit 56 which generates a word line drive timing signal RXT in accordance with the output signal of row decode control circuit 55, and a sense control circuit 57 which generates a sense amplifier enable signal SEN in accordance with the output signal of word line select control circuit 56.

Control circuits 52 to 57 also drive the corresponding control signals into standby states in a predetermined sequences in response to deactivation of row activation signal ACT.

Each of control circuits 52 to 57 substantively formed of a delay circuit, and drives the corresponding control signal into a predetermined state after the passage of predetermined time in response to the activation of the output signal of the preceding stage circuit. The delay time of equalization control circuit 54 is variable, so that equalization control circuit 54 drives equalization control signal EQF to L level after bit line isolation control signal ZBLIF rises to H level in the self refresh mode. That is, in the self refresh mode, after the selected memory block is connected to the corresponding sense amplifier bands and the common bit lines are precharged at the predetermined voltage level, equalization control circuit 54 stops its bit line equalization operation. In the normal operation mode, the delay time of equalization control circuit 54 is set shorter and equalization control circuit 54 drives equalization control signal EQF to L level substantially at the same timing as bit line isolation control signal ZBLIF.

Figure 13:
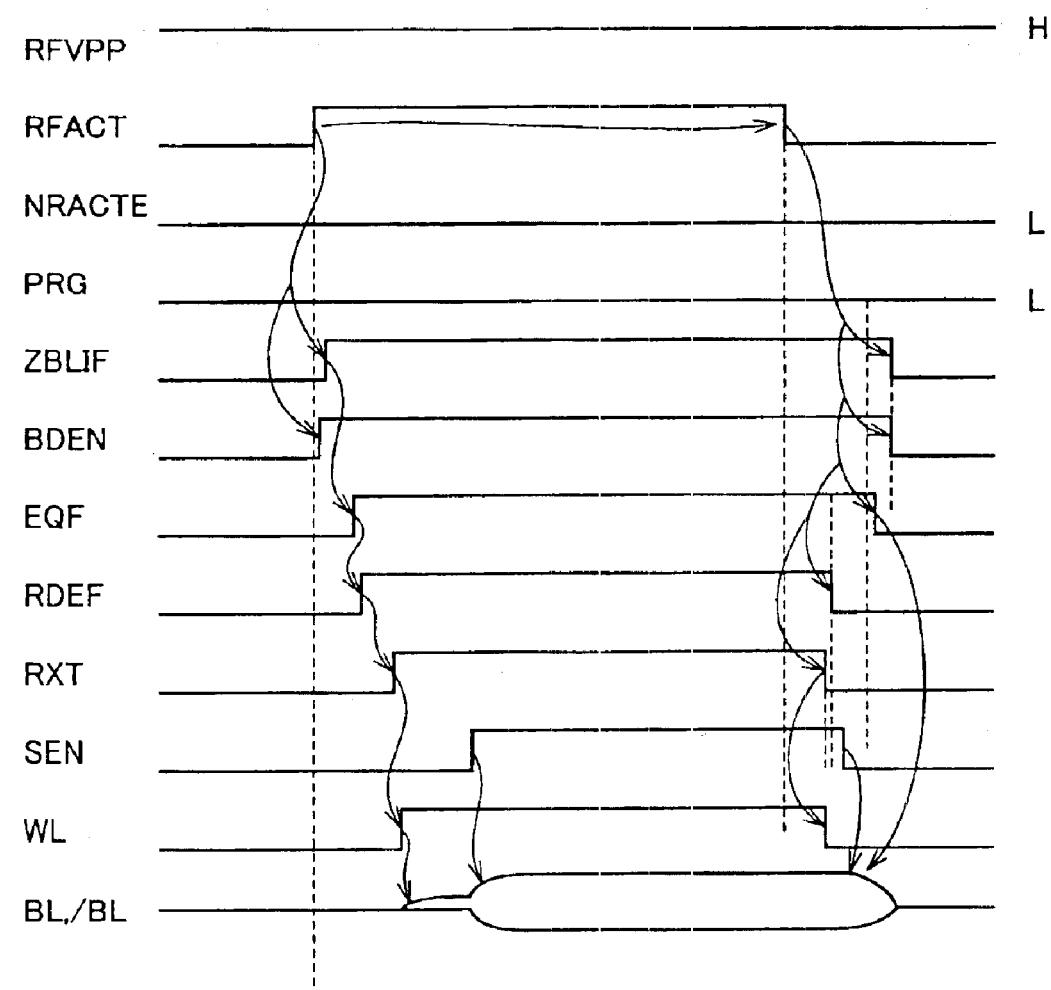
FIG. 13 is a signal waveform diagram representing an operation of the row related main control circuit shown in FIG. 12 in the self refresh mode.

FIG. 13 is a signal waveform diagram representing an operation of row related main control circuit 24 shown in FIG. 12 in the self refresh mode. Referring to FIG. 13, the operation of row related main control circuit 24 shown in FIG. 12 in the self refresh mode will be described. Normal row access instruction signal NRACTE and precharge instruction signal PRG are both at L level.

In the self refresh mode, isolation control switch signal RFVPP is at H level of high voltage VPP level, and the delay time of equalization control circuit 54 is set longer than that in the normal operation mode. In accordance with a refresh request, refresh row activation signal RFACT is maintained at H level for predetermined time. In response to the rise of refresh row activation signal RFACT, block decode control circuit 53 activates block decoder enable signal BDEN and then isolation control circuit 52 drives isolation control signal ZBLIF to H level. By activating block decoder enable signal BDEN from block decode control circuit 53 at fast timing, the block select signal for specifying a selected memory block is driven into a definite state at a fast timing.

After isolation control signal ZBLIF rises to H level and the selected memory block is connected to the corresponding sense amplifier bands, equalization control signal EQF is risen to H level. After the sense nodes of the sense amplifiers are precharged and equalized by the bit line precharge/equalization circuits of the corresponding memory block, the bit line precharge/equalization operation is stopped. When equalization control signal EQF is driven to H level, row decoder enable signal RDEF from row decode control circuit 55 is driven to H level substantially at the same timing. In response to row decoder enable signal RDEF, the row decoder provided in correspondence to the selected memory block starts a decoding operation.

Then, word line drive timing signal RXT from word line select control circuit 56 is driven to H level, and word line WL selected through the decoding operation is driven to the high voltage level. As a result, data stored in the selected memory cell is read onto bit lines BL and /BL.

After a predetermined time passes since word line WL is driven into a selected state, sense control circuit 57 drives sense amplifier enable signal SEN to an active state. Accordingly, in the sense amplifier bands provided for the selected memory block, sensing operation is performed and bit lines BL and /BL are driven to the power supply voltage level and the ground voltage level in accordance with the data stored in the corresponding memory cell. The memory cell data amplified and latched by the sense amplifier is rewritten to the original memory cell and the data stored in this memory cell is thereby refreshed.

After the passage of the predetermined time, refresh row activation signal RFACT falls to L level, thus completing the active cycle in the refresh mode. Accordingly, word line drive timing signal RXT is first driven to L level and word line WL is driven to the unselected state. Then, row decoder enable signal RDEF and sense amplifier enable signal SEN are driven to the inactive state.

Further, equalization control signal EQF is driven to L level, the bit line precharge/equalization operation is performed in the selected memory block and, at the same time, the precharge/equalization operation for the sense nodes of the corresponding sense amplifier bands (common bit lines) is executed. Thereafter, isolation control signal ZBLIF attains H level and the selected sense amplifier bands are isolated from the corresponding memory block.

In the above-stated operation sequence, the bit line precharge/equalization operation is completed after the sense amplifier bands are connected to the selected memory block in the self refresh mode. After the refresh operation, the bit line isolation gate is set to be nonconductive after executing the bit line equalization. Therefore, even if the standby state is maintained while isolating the sense amplifier bands from the memory blocks, it is possible to ensure reading of the memory cell data after the sense nodes of the sense amplifiers (common bit lines) are precharged at the predetermined voltage level. After the completion of the refresh operation, transition in made to the standby state after the sense nodes (common bit lines) are precharged and equalized at the predetermined voltage.

Furthermore, since equalization control signal EQF is driven at a later timing than the rise of bit line isolation control signal ZBLIF, word line select start and sense operation start timings are later than those in the normal operation mode. However, since no data access is performed in the self refresh mode, no problems arises.

Figure 14:
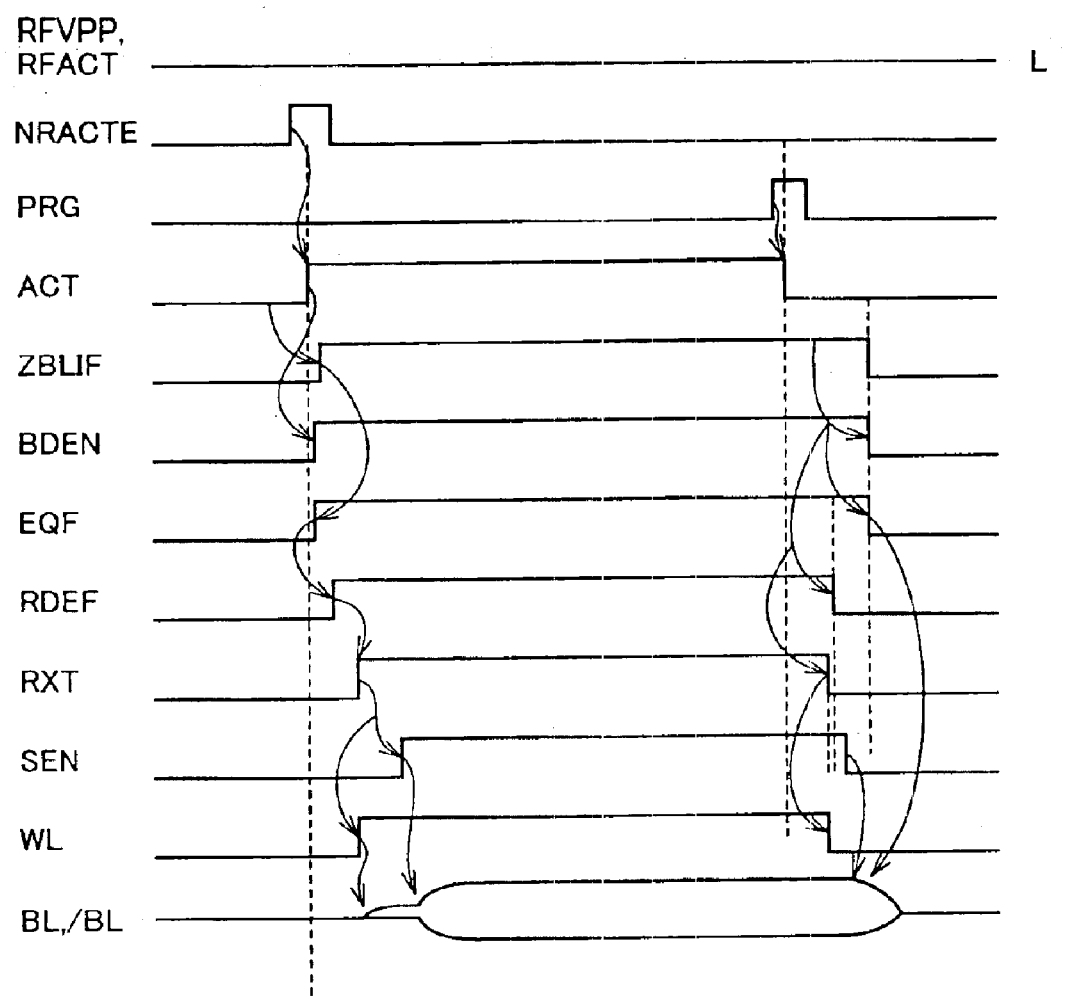
FIG. 14 is a signal waveform diagram representing an operation of the row related main control circuit shown in FIG. 12 at a normal operation mode.

FIG. 14 is a signal waveform diagram representing an operation of row related main control circuit 24 shown in FIG. 12 in the normal operation mode. Referring to FIG. 14, the operation of row related main control circuit 24 in the normal operation mode will be described.

In the normal operation mode, refresh row activation signal RFACT and isolation control switch signal RFVPP are at L level.

In this normal operation mode, the operation mode is designated in accordance with an external command. In row selection, normal row access instruction signal NRACTE is first generated in a one-shot pulse form and set/reset flip-flop 50 is set, responsively. In this state, row activation signal ACT from OR circuit 51 rises to H level and isolation control signal ZBLIF rises to H level, responsively. Further, block decoder enable signal BDEN from block decode control circuit 53 rises to H level.

In the normal operation mode, the sense amplifier bands are connected to the memory blocks in the standby state. Since the sense nodes (common bit lines) of the sense amplifiers are precharged at the intermediate voltage level and isolation control switch signal RFVPP is at L level, equalization control circuit 54 raises equalization control signal EQ to H level substantially at the same timing as isolation control signal ZBLIF. In accordance with the rise of equalization control signal EQF to H level, row decode control circuit 55, word line select control circuit 56 and sense control circuit 57 sequentially drive row decoder enable signal RDEF, word line drive timing signal RXT and sense enable signal SEN into active states, respectively.

In equalization control circuit 54, equalization control signal EQF in this normal operation mode is set to rise earlier than the rising in the self refresh mode. Therefore, in the normal operation mode, the select timing of word line WL is advanced relative to that in the self refresh mode and the activation timing of sense amplifier activation signal SEN can be earlier than that in the self refresh mode. After the voltages of bit lines BL and /BL are sensed, amplified and latched by the sense amplifier circuit, a column select operation is performed and data access is made.

When the access cycle is completed, precharge instruction signal PRG is generated and row activation signal ACT attains L level, responsively. Thereafter, control circuits 52 to 57 sequentially drive the corresponding control signals into the standby states in a predetermined sequence. In this case, equalization control circuit 54 drives equalization control circuit EQF to L level substantially at the same timing as isolation control signal ZBLIF, unlike the self refresh mode. In this case, the selected block is connected to the corresponding sense amplifier bands even in the standby state. Therefore, even if the connection between the unselected memory blocks and the sense amplifier bands and the bit line equalization are executed at the same timing, no problems arise. In the normal operation mode, equalization control signal EQF may be lowered to L level at a faster timing than falling of bit line control signal ZBLIF.

In this normal operation mode, equalization control signal EQF is changed substantially at the same timing as isolation control signal ZBLIF. Therefore, unlike the self refresh mode, it is possible to drive the word line into a selected state at a faster timing and to prevent access time from being increased.

Figure 15:
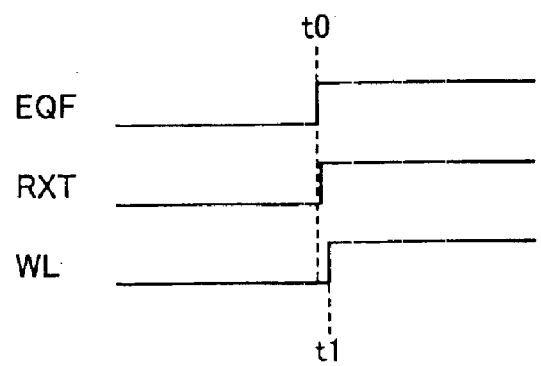
FIG. 15 shows the timing relationship between an equalization control signal and an activation of a selected word line according to the first embodiment of the present invention.

In the normal operation mode, similarly to the self refresh mode, when equalization control signal EQF is driven to H level and the bit line precharge/equalization operation is completed before a word line is selected, it is possible to accurately perform a sensing operation. Therefore, after bit line isolation control signal ZBLIF attains L level, equalization control signal EQF may be driven to L level. Namely, as shown in FIG. 15, provided that the time t0 at which equalization control signal EQ rises to H level is earlier than the time t1 at which word line WL is driven into a selected state, it is possible to accurately sense, amplify and latch the memory cell data using the sense amplifier both in the normal operation mode and the self refresh mode. Accordingly, the deactivation timing of equalization control signal EQF needs only to be set at an appropriate timing in view of access time and others.

Figure 16:
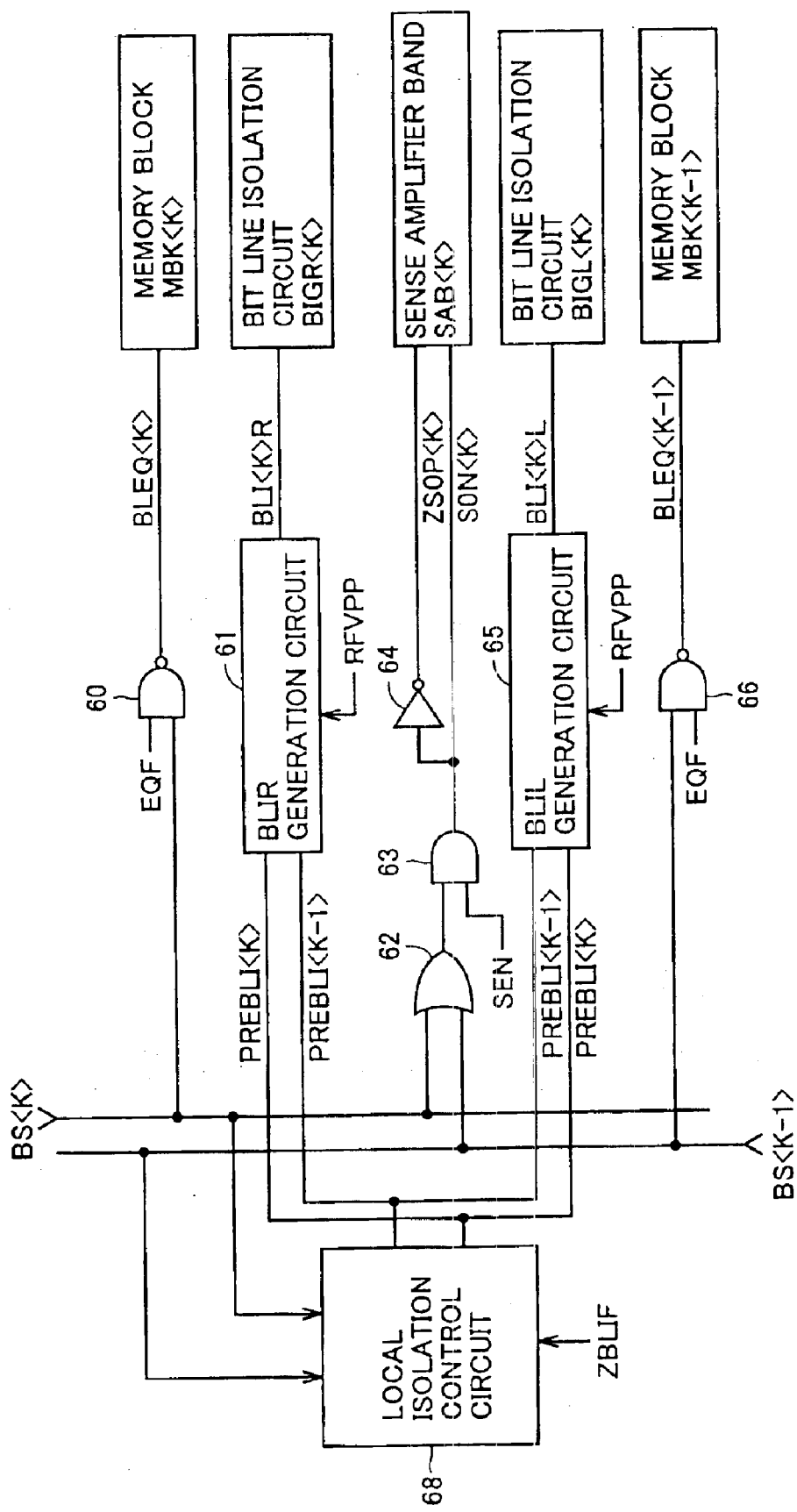
FIG. 16 is a schematic diagram showing a configuration of a row related local control circuit shown in FIG. 9.

FIG. 16 is a schematic diagram showing the configuration of row related local control circuit 36 shown in FIG. 9. In FIG. 16, row related local control circuit 36 includes a NAND circuit 60 which receives equalization control signal EQF and block select signal BS<K> and generates bit line equalization instruction signal BLEQ<K>, a NAND circuit 66 which generates block select signal BS<K-1> and equalization control signal BLEQ<K-1>, an OR circuit 62 which receives block select signals BS<K> and BS<K-1>, an AND circuit 63 which receives sense amplifier enable signal SEN and the output signal of OR circuit 62 and generates a sense amplifier activation signal S0N<K>, an inverter circuit 64 which inverts the output signal of AND circuit 63 and generates sense amplifier activation signal ZS0P<K>, a local isolation control circuit 68 which receives block select signals BS<K> and BS<K-1> and isolation control signal ZBLIF and generates pre-bit line isolation control signals PREBLI<K> and PREBLI<K-1> in accordance with isolation control signal ZBLIF, a BLIR generation circuit 61 which receives pre-bit line isolation control signals PREBLI<K> and PREBLI<K-1>, selects one of pre-bit line isolation control signals PREBLI<K> and PREBLI<K-1> in accordance with isolation control signal RFVPP, and generates a bit line isolation instruction signal BLI<K>R, and a BLIL generation circuit 65 which receives pre-bit line isolation control signals PREBLI<K-1> and PREBLI<K>, selects one of pre-bit line isolation control signals PREBLI<K> and PREBLI<K-1> in accordance with isolation control signal RFVPP, and generates a bit line isolation instruction signal BLI<K>L.

Bit line isolation instruction signals BLEQ<K> and BLEQ<K-1> from NAND circuits 60 and 66 are applied to bit line precharge/equalization circuits included in memory blocks MBK<K> and MBK<K-1>, respectively.

Sense amplifier activation signals S0N<K> and ZS0P<K> are applied to the N-sense amplifiers and the P-sense amplifiers included in sense amplifier band SAB<K>, respectively.

When memory block MBK<K> is selected, block select signal BS<K> attains H level. Therefore, bit line equalization instruction signal BLEQ<K> attains L level in response to the rise of equalization control signal EQF, and the bit line precharge/equalization operation in memory block MBK<K> is stopped. In this case, block select signal BS<K-1> is at L level, bit line equalization instruction signal BLEQ<K-1> from NAND circuit 66 is at H level, and a bit line precharge/equalization operation is kept active in unselected memory block MBK<K-1>.

When either memory block MBK<K> or MBK<K-1> is selected, the output signal of OR circuit 62 attains H level in accordance with block select signals BS<K> or BS<K-1>. Therefore, sense amplifier activation signal S0N<K> and ZS0P<K> are activated in accordance with the activation of sense amplifier enable signal SEN, and the sense amplifiers in sense amplifier band SAB<K> are activated.

BLIR generation circuit 61 and BLIL generation circuit 66 generate bit line isolation instruction signals BLI<K>R and BLI<K>L in a different manner between the normal operation mode and the refresh operation mode. In the normal operation mode, BLIR generation circuit 61 drives bit line isolation instruction signal BLI<K>R to the ground voltage level when memory block MBK<K–1> is selected, and otherwise maintains the same at the high voltage VPP level. BLIL generation circuit 65 drives bit line isolation instruction signal BLI<K–1>L to the ground voltage level when memory block MBK<K> is selected, and otherwise maintains the level thereof at the high voltage VPP level.

In the self refresh mode, BLIR generation circuit 65 drives bit line isolation instruction signal BLI<K>R to the high voltage VPP level when memory block MBK<K> is selected, and otherwise maintains the level thereof at the ground voltage level. BLIL generation circuit 65 drives bit line isolation instruction signal BLI<K>L to the high voltage VPP level when memory block MBK<K–1> is selected, and otherwise maintains the level thereof at the ground voltage level.

Figure 17:
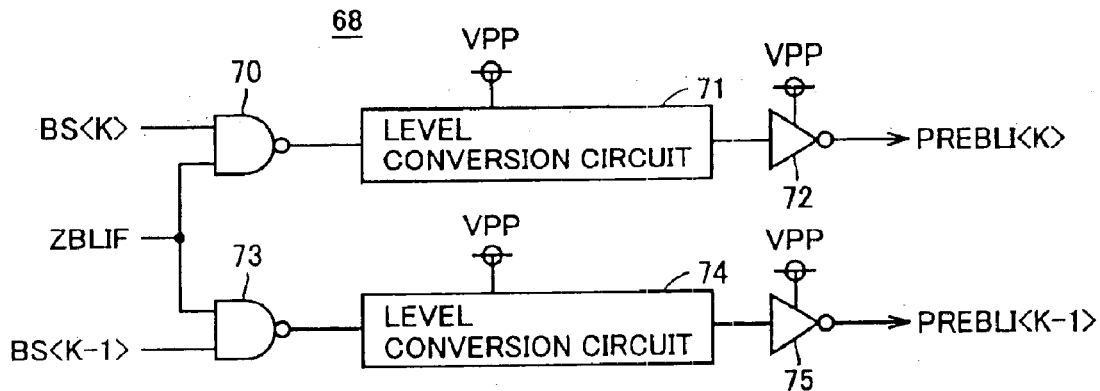
FIG. 17 is a schematic diagram showing a configuration of a local isolation control circuit shown in FIG. 16.

FIG. 17 is a schematic diagram of the configuration of local isolation control circuit 68 shown in FIG. 16. In FIG. 17, local isolation control circuit 68 includes a NAND circuit 70 which receives block select signal BS<K> and isolation control signal ZBLIF, a level conversion circuit 71 which converts H level of the peripheral power supply voltage level of the output signal of NAND circuit 70 into the high voltage VPP level, and an inverter circuit 72 which inverts the output signal of level conversion circuit 71 and generates pre-bit line isolation control signal PREBLI<K> having the amplitude of high voltage VPP. Level conversion circuit 71 converts only the voltage level of the output signal of NAND circuit 70 and does not converts the logic level thereof.

Local isolation control circuit 68 further includes a NAND circuit 73 which receives isolation control signal ZBLIF and block select signal BS<K–1>, a level conversion circuit 74 which converts the voltage level of the output signal of NAND circuit 73, and an inverter circuit 75 which inverts the output signal of level conversion circuit 74 and generates pre-bit line isolation control signal PREBLI<K–1> having the amplitude of high voltage VPP. Level conversion circuit 74 has a configuration similar to that of level conversion circuit 71. Each of level conversion circuits 71 and 74 is formed of an ordinary latch type level conversion circuit and converts a signal at peripheral power supply Vdd level into a signal at high voltage VPP level.

In a standby state, block select signals BS<K> and BS<K–1> are both at L level and the output signals of NAND circuits 70 and 73 are both at H level. Therefore, pre-bit line isolation control signals PREBLI<K> and PREBLI<K–1> outputted from respective inverters 72 and 75 are both at L level.

In memory block selection, when block select signal BS<K> is driven to H level, isolation control signal ZBLIF attains H level and the output signal of NAND circuit 70 attains L level, responsively. Since level conversion circuit 71 does not converts logic level, pre-bit line isolation control signal PREBLI<K> from inverter circuit 72 attains the high voltage VPP level. Since block select signal BS<K–1> is at L level, pre-bit line isolation control signal PREBLI<K–1> is maintained at L level.

A control signal for switching the logic of the bit line isolation instruction signal in the self refresh mode is not applied to local isolation control circuit 68. Therefore, the operation of local isolation control circuit 68 is the same in the normal operation mode and in the self refresh mode.

Figure 18:
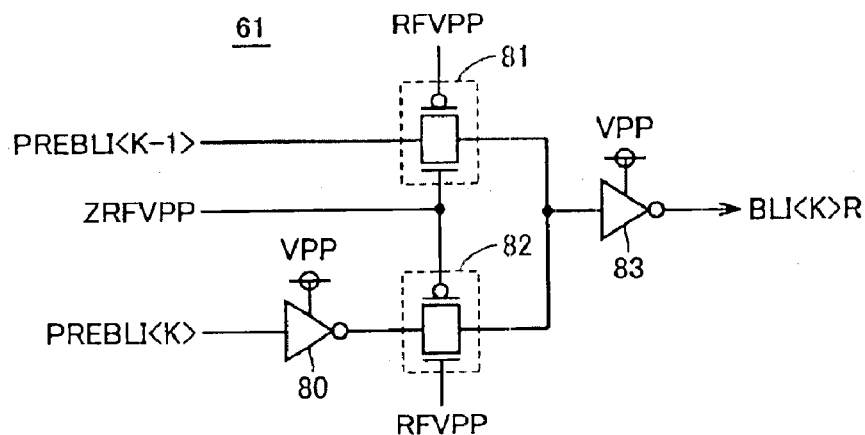
FIG. 18 shows an example of a configuration of a BLIR generation circuit shown in FIG. 16.

FIG. 18 is a schematic diagram showing the configuration of BLIR generation circuit 61 shown in FIG. 16. In FIG. 18, BLIR generation circuit 61 includes an inverter 80 which inverts pre-bit line isolation control signal PREBLI<K>, a CMOS transmission gate 81 which transmits pre-bit line isolation control signal PREBLI<K–1> in accordance with isolation control switch signal RFVPP and a complementary isolation control switch signal ZRFVPP, a CMOS transmission gate 82 which transmits the output signal of inverter 80 in accordance with isolation control switch signals RFVPP and ZRFVPP, and an inverter circuit 83 which inverts the output signal of CMOS transmission gate 81 or 82 and generates bit line isolation instruction signal BLI<K>R.

CMOS transmission gates 81 and 82 are made conductive complementarily to each other. In the normal operation mode, CMOS transmission gate 81 is made conductive and CMOS transmission gate 82 is made nonconductive. Therefore, bit line isolation instruction signal BLI<K>R is generated in accordance with pre-bit line isolation control signal PREBLI<K–1>.

In the self refresh mode, CMOS transmission gate 81 is made nonconductive and CMOS transmission gate 82 is made conductive. Therefore, bit line isolation instruction signal BLI<K>R is generated in accordance with pre-bit line isolation control signal PREBLI<K>.

Figure 19:
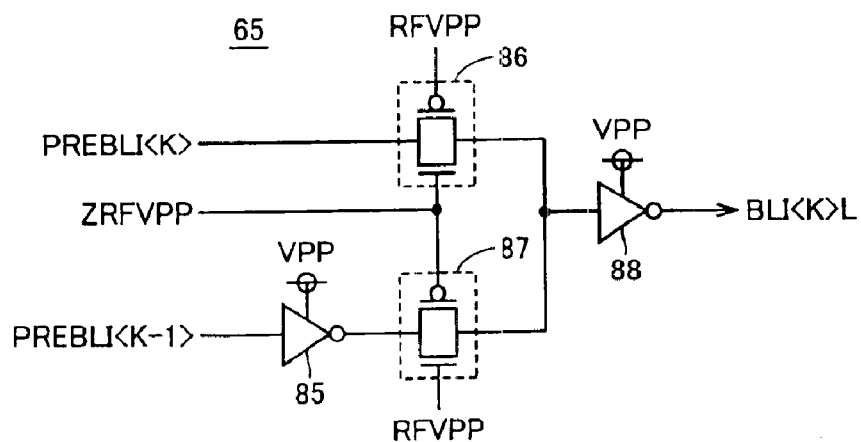
FIG. 19 shows an example of a configuration of a BLIL generation circuit shown in FIG. 16.

FIG. 19 is a schematic diagram showing the configuration of BLIL generation circuit 65 shown in FIG. 16. In FIG. 19, BLIL generation circuit 65 includes an inverter circuit 85 which inverts pre-bit line isolation control signal PREBLI<K–1>, a CMOS transmission gate 86 which is selectively made conductive in accordance with isolation control switch signal RFVPP and complementary isolation control switch signal ZRFVPP and transmits pre-bit line isolation control signal PREBLI<K> when conductive, a CMOS transmission gate 87 which transmits the output signal of inverter circuit 85 in accordance with isolation control switch signals RFVPP and ZRFVPP, and an inverter circuit 88 which inverts the output signal of CMOS transmission gate 86 or 87 and generates bit line isolation instruction signal BLI<K>L. Inverter circuits 85 and 88 receive high voltage VPP as an operating power supply voltage.

In BLIL generation circuit 65 shown in FIG. 19, in the normal operation mode, CMOS transmission gate 86 is made conductive and CMOS transmission gate 87 is made nonconductive. Therefore, bit line isolation instruction signal BLI<K>L is generated in accordance with pre-bit line isolation control signal PREBLI<K>. In the self refresh mode, CMOS transmission gate 86 is made nonconductive and CMOS transmission gate 87 is made conductive. Therefore, bit line isolation instruction signal BLI<K>L is generated in accordance with pre-bit line isolation control signal PREBLI<K–1>.

Figure 20:
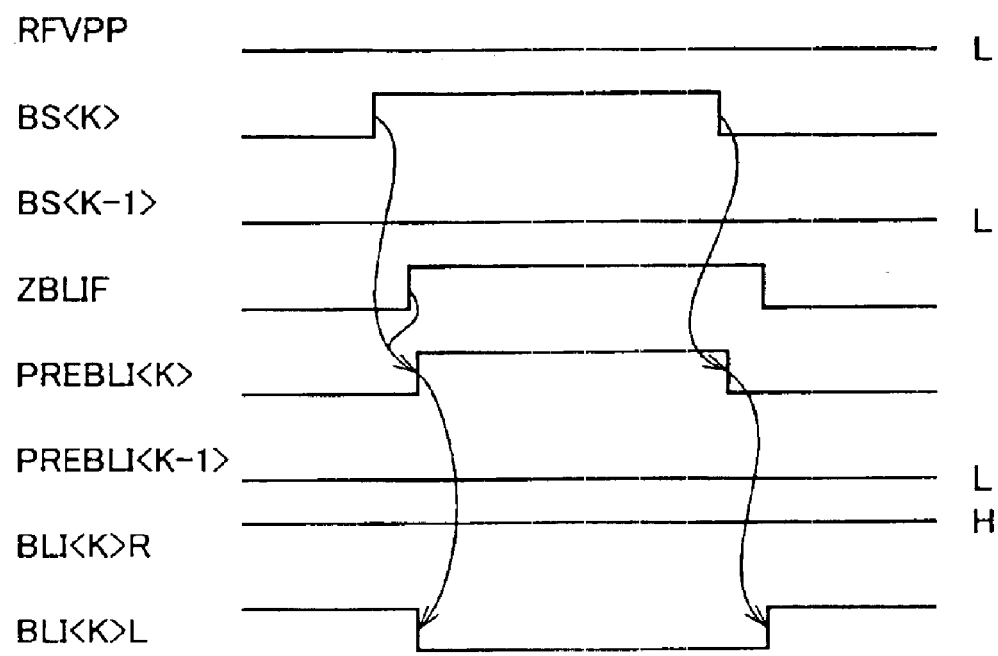
FIG. 20 is a timing chart representing an operation of the circuits shown in FIGS. 17 to 19 in the normal operation mode.

FIG. 20 is a signal waveform diagram representing an operation of the circuitry shown in FIGS. 17 to 19 in the normal operation mode. In FIG. 20, the operation in the case when block select signal BS<K> is driven to the selected state and a memory cell in memory block MB<K> shown in FIG. 16 is selected are shown.

In the normal operation mode, isolation control switch signal RFVPP is at L level, CMOS transmission gate 81 shown in FIG. 18 and CMOS transmission gate 86 shown in FIG. 19 are made conductive, and CMOS transmission gate 82 shown in FIG. 18 and CMOS transmission gate 87 shown in FIG. 19 are made nonconductive.

When a memory cycle (active cycle) starts, block select signal BS<K> is first driven to H level. When isolation control signal ZBLIF is driven to H level, the output signal of NAND circuit 70 shown in FIG. 17 attains L level and pre-bit line isolation control signal PREBLI<K> rises to H level, responsively. Since block select signal BS<K−1> is at L level, pre-bit line isolation control signal PREBLI<K−1> is maintained at L level.

Since bit line isolation instruction signal BLI<K>R is generated in accordance with pre-bit line isolation control signal PREBLI<K−1>, BLI<K>R is maintained at H level (high voltage VPP level). On the other hand, as shown in FIG. 19, bit line isolation instruction signal BLI<K>L is generated in accordance with pre-bit line isolation control signal PREBLI<K> in the normal operation mode. Therefore, bit line isolation instruction signal BLI<K>L falls to L level in response to the rise of pre-bit line isolation control signal PREBLI<K>.

When the memory cycle is completed, block select signal BS<K> attains L level. Accordingly, the output signal of NAND circuit 70 shown in FIG. 17 attains H level and pre-bit line isolation control signal PREBLI<K> attains L level. In response to pre-bit line isolation control signal PREBLI<K>, bit line isolation instruction signal BLI<K>L shown in FIG. 19 rises to H level and bit line isolation circuit BIGL<K> shown in FIG. 16 is made conductive.

In the normal operation mode, therefore, when memory block MBK<K> shown in FIG. 16 is selected, bit line isolation circuit BIGR<K> is maintained conductive and bit line isolation circuit BIGL<K> is turned nonconductive. In this case, in unselected memory block MBK<K−1>, bit line precharge/equalization is performed in accordance with bit line equalization instruction signal BLEQ<K−1>.

In selected memory block MBK<K>, bit line equalization instruction signal BLEQ<K> attains L level, so that a precharge operation is stopped during memory cycle.

Figure 21:
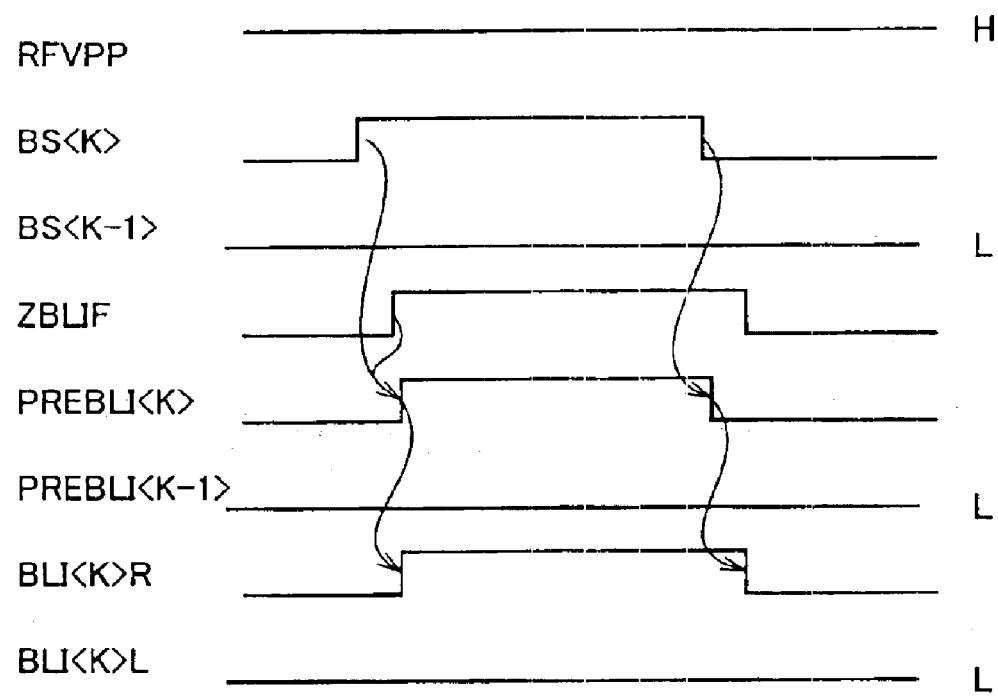
FIG. 21 is a timing chart representing an operation of the circuits shown in FIGS. 17 to 19 in the self refresh mode.

FIG. 21 is a signal waveform diagram representing an operation of the circuitry shown in FIGS. 17 to 19 in the self refresh mode. Referring to FIG. 21, the operation of the circuitry shown in FIGS. 17 to 19 in the self refresh mode will be described, while taking a case of selecting and refreshing memory block MBK<K> as an example.

The operation of local isolation control circuit 68 shown in FIG. 17 is the same in the self refresh mode and in the normal operation mode. Pre-bit line isolation control signal PREBLI<K> rises to H level in accordance with block select signal BS<K> and isolation control signal ZBLIF. Pre-bit line isolation control signal PREBLI<K−1> is maintained at L level.

In this state, in BLIR generation circuit 61 shown in FIG. 18, CMOS transmission gate 82 is made conductive and bit line isolation instruction signal BLI<K>R is generated in accordance with pre-bit line isolation control signal PREBLI<K>. In BLIL generation circuit 65 shown in FIG. 19, CMOS transmission gate 87 is made conductive and bit line isolation instruction signal BLI<K>L is generated in accordance with pre-bit line isolation control signal PREBLI<K−1>. Therefore, when pre-bit line isolation control signal PREBLI<K> rises to H level, bit line isolation instruction signal BLI<K>R rises to H level. Since pre-bit line isolation control signal PREBLI<K−1> is at L level, bit line isolation instruction signal BLI<K>L is maintained at L level. When the refresh operation is completed and block select signal BS<K> rises to L level, pre-bit line isolation instruction signal PREBLI<K> attains L level and bit line isolation instruction signal BLI<K>R falls to L level, responsively.

In this self refresh mode, therefore, bit line isolation instruction signals BLI<K>R and BLI<K>L are at L level and sense amplifier band SA<K> shown in FIG. 16 is isolated from corresponding memory blocks MBK<K> and MBK<K−1> in a standby state. When memory block MBK<K> is selected, bit line isolation circuit BIGR<K> is made conductive and sense amplifier band SAB<K> is connected to memory block MBK<K>.

The configuration shown in FIG. 16 is provided in correspondence to each sense amplifier band. In the normal operation mode, therefore, the bit line isolation instruction signal is generated based on the block select signal for an adjacent memory block which shares the sense amplifier band, and the connection between the memory block of interest and the sense amplifier bands is controlled. On the other hand, in the self refresh mode, the bit line isolation instruction signal is generated in accordance with the signal generated based on the memory block select signal for the target memory block, and the connection between the target memory block and the sense amplifier bands is controlled. Therefore, in a standby state in the normal operation mode, it is possible to electrically connect all the sense amplifier bands to the corresponding memory blocks. In the self refresh mode, it is possible to connect only a selected memory block to the corresponding sense amplifier bands and to isolated all the other memory blocks from the corresponding sense amplifier bands during the refresh operation.

Modification

Figure 22:
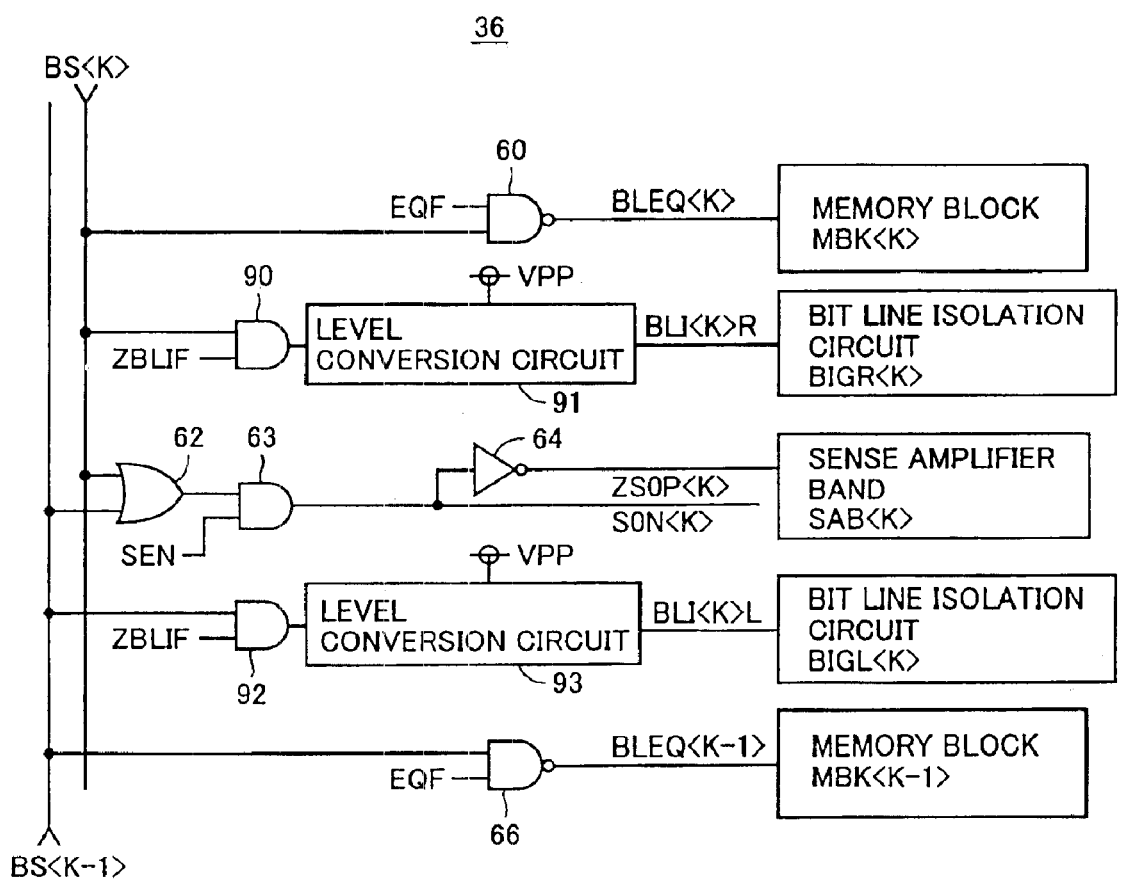
FIG. 22 is a schematic diagram showing the configuration of the row related local control circuit according to a modification of the first embodiment of the present invention.

FIG. 22 is a schematic diagram showing the configuration of the row related local control circuit according to a modification of the first embodiment of the present invention. In row related local control circuit 36 shown in FIG. 22, a section that generates bit line isolation instruction signals BLI<K>R and BLI<K>L differs in configuration from that of row related local control circuit 36 shown in FIG. 16. For bit line isolation instruction signal BLI<K>R, an AND circuit 90 which receives block select signal BS<K> and isolation control signal ZBLIF, and a level conversion circuit 91 which converts the output signal of AND circuit 90 into a signal at high voltage VPP level and generates bit line isolation instruction signal BLI<K>R are provided.

For isolation instruction signal BLI<K>L, an AND circuit 92 which receives block select signal BS<K−1> and isolation control signal ZBLIF, and a level conversion circuit 93 which converts the output signal of AND circuit 92 and generates bit line isolation instruction signal BLI<K>L are provided. Level conversion circuit 93 converts the output signal at peripheral power supply voltage level of AND circuit 92 into a signal at a high voltage VPP level.

Since the other components of row related local control circuit 36 shown in FIG. 22 are the same in configuration to those of row related local control circuit 36 shown in FIG. 16, the corresponding elements are denoted by the same reference numerals, and the detailed description thereof will not be repeated.

In the configuration of row related local control circuit 36 shown in FIG. 22, the output signals of AND circuits 90 and 92 are both at L level and bit line isolation instruction signals BLI<K>R and BLI<K>L are both at ground voltage level in a standby state. Therefore, bit line isolation circuits BIGR<K> and BIGL<K> are made nonconductive and sense amplifier band SAB<K> is isolated from memory blocks MBK<K> and MBK<K−1>.

In memory block selection, when block select signal BS<K> is driven to H level, for example, the output signal of AND circuit 90 attains H level in response to the rise of isolation control signal ZBLIF. Accordingly, bit line isolation instruction signal BLI<K>R attains high voltage VPP level, bit line isolation circuit BIGR<K> is made conductive and memory block MBK<K> is connected to sense amplifier band SAB<K>. Since block select signal BS<K−1> is unselected, bit line isolation instruction signal BLI<K>L is at ground voltage level and bit line isolation circuit BIGL<K> is maintained nonconductive. Therefore, only the selected memory block is connected to the corresponding sense amplifier bands while all the unselected memory blocks are isolated from the corresponding sense amplifier bands.

In the configuration of row related local control circuit 36 shown in FIG. 22, an instruction signal for switching the logic of the bit line isolation instruction signal in the self refresh mode is not employed. Therefore, a common operation is performed between the normal operation mode and the self refresh mode, and only the selected memory block is connected to the corresponding sense amplifier bands. In a standby state in the normal operation mode, therefore, it is possible to prevent a leakage current from flowing from the equalization transistors in the sense amplifier bands through the high-resistive short circuit between the bit line and the word line and to thereby reduce a standby current.

As the configuration of row related main control circuit 24 for row related local control circuit 36 shown in FIG. 22, the configuration shown in FIG. 12 can be used. In this case, in the configuration shown in FIG. 12, it is particularly not required to change the generation timing of equalization control signal EQF between the self refresh mode and the normal operation mode. After turning the bit line isolation gate conductive, the bit line precharge/equalization operation is completed before driving of the word line to the selected state. During data access, it is possible to drive the word line to the selected state at a faster timing and to activate the sense amplifier circuits without adversely influencing an access time.

When the resistance of the short circuit is high and the bit line and word line can be normally driven, it is possible to reduce current consumption in a standby state. In addition, even if the resistance of the short circuit is low and redundancy replacement is performed, it is possible to reduce the current consumption in the standby state by isolating the short-circuit resistance from the sense amplifiers. In this case, however, it is necessary to reduce the bit line precharge transistors and equalization transistors in size in order to sufficiently make small a leakage current from the bit line precharge/equalization circuit.

As described above, according to the first embodiment of the present invention, all the sense amplifier bands are configured to be isolated from the corresponding memory blocks at least in the standby state and only the selected memory block is connected to the corresponding sense amplifier bands. Therefore, in the standby state, it is possible to prevent the leakage current from flowing from the sense amplifier band through the short circuit between the word line and the bit line and to thereby reduce current consumption. Particularly in the self refresh mode, by executing controlling the connection between the memory blocks and the sense amplifier bands, it is possible to reduce current consumption in the data holding mode in which low power consumption is required.

Second Embodiment

Figure 23:
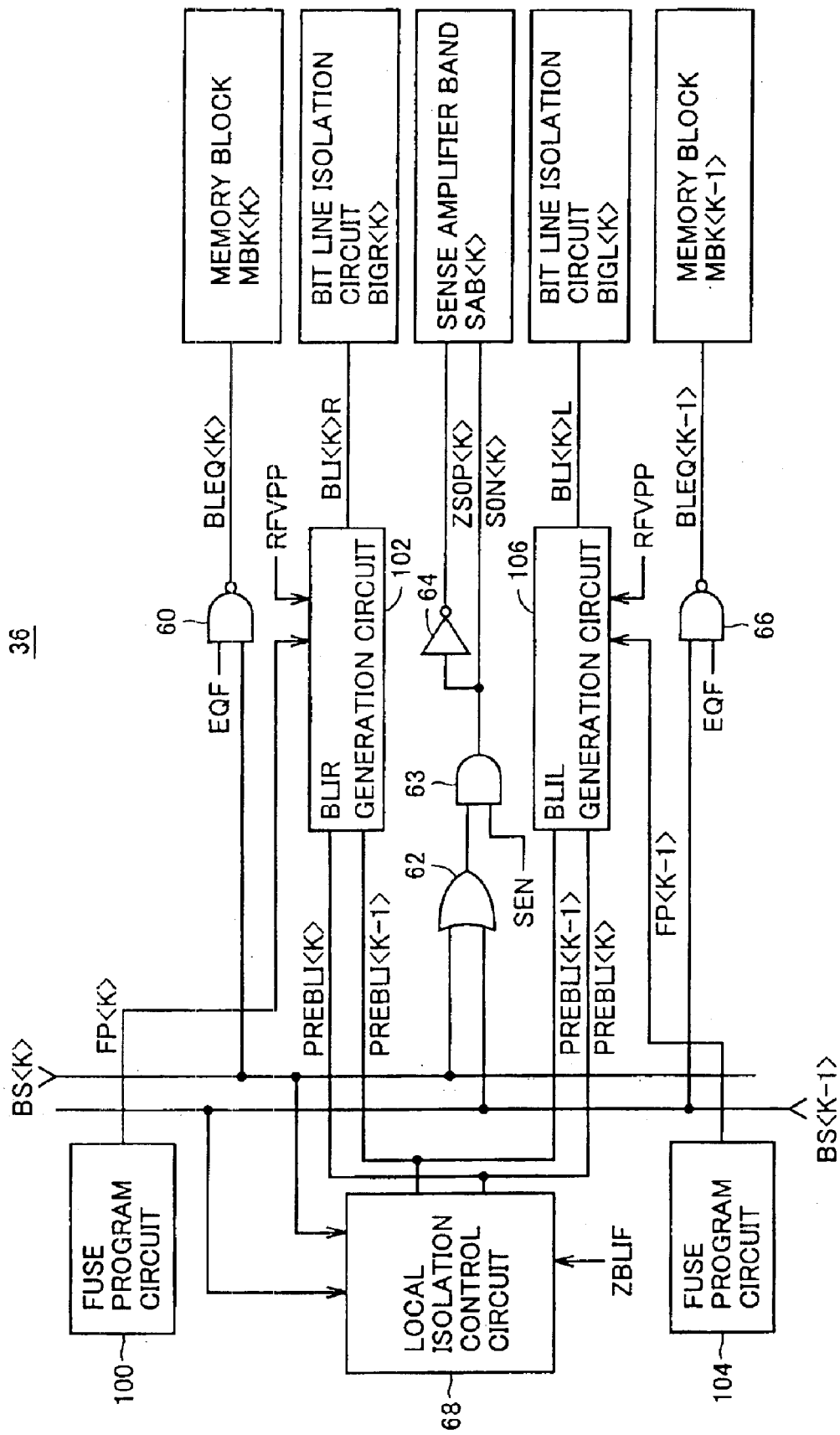
FIG. 23 is a schematic diagram showing the configuration of the row related local control circuit according to a second embodiment of the present invention.

FIG. 23 is a schematic diagram showing the configuration of the row related local control circuit according to a second embodiment of the present invention. Row related local control circuit 36 shown in FIG. 23 differs in configuration from row related local control circuit 36 shown in FIG. 16 in the following points. Fuse program circuits 100 and 104 are provided in correspondence to memory blocks MBK<K> and MBK<K−1>, respectively. Data as to whether a short circuit exists between the bit line and the word line in corresponding memory blocks MBK<K> or MBK<K−1> is programmed in each of fuse program circuits 100 and 104 by blow/non-blow of a link element.

A BLIR generation circuit 102 which generates bit line isolation instruction signal BLI<K>R selects either pre-bit line isolation control signal PREBLI<K> or PREBLI<K−1> applied from local isolation control circuit 68 in accordance with program data FP<K> from fuse program circuit 100 and isolation control switch signal RFVPP, and generates bit line isolation instruction signal BLI<K>R.

A BLIL generation circuit 106 which generates bit line isolation instruction signal BLI<K>L selects either pre-bit line isolation control signal PREBLI<K−1> or PREBLI<K> applied from local isolation control circuit 68 in accordance with program data FP<K−1> from fuse program circuit 104 and isolation control switch signal RFVPP, and generates bit line isolation instruction signal BLI<K>L. Since the other components of row related local control circuit 36 shown in FIG. 23 are the same in configuration to those of row related local control circuit 36 shown in FIG. 16, the corresponding components are denoted by the same reference numerals, and the detailed description thereof will not be repeated.

In the configuration of row related local control circuit 36 shown in FIG. 23, the connection between the sense amplifier bands and the memory blocks is controlled for each memory block in a self refresh mode. The existence of the short circuit between a word line and a bit line in each memory block can be identified by detecting a leakage current in the precharge voltages of the common source nodes of sense amplifiers in a memory block unit in a test (by connecting only one memory block to a sense amplifier band and detecting a leakage current in the precharge voltage).

In addition, in the test, it is possible for a tester to store which memory block contains a short circuit between a bit line and a word line. Based on the defect detection result of this test, each of fuse program circuits 100 and 104 is subject to programming (setting blow/non-blow) of a link element in the same step as a defective address programming performed to repair a defective memory cell in the test final step.

To detect a leakage current for the sense amplifier precharge voltage in each memory block, a switching transistor is provided on a path for supplying the sense amplifier precharge voltage in each sense amplifier band and the sense amplifier precharge voltage is supplied for each sense amplifier band. In addition, only one memory block is connected to the corresponding sense amplifier band by the bit line isolation instruction signal. A current flowing in the precharge voltage generation circuit is detected using, for example, a current-mirror circuit externally. Alternatively, this precharge voltage is supplied from an external tester and a current flowing at this time is detected by the external tester.

When the precharge voltage generation circuit generates both the sense amplifier precharge voltage and the bit line precharge voltage, all the bit line equalization instruction signals are set to be inactive and the bit line precharge/equalization transistors are set nonconductive. When the precharge voltage generation circuit is provided separately for the bit line and for the sense amplifier, the bit line precharge voltage generation circuit is set inactive.

Current consumption is measured for each memory block and it is detected whether a leakage current flows. A memory block in which a leakage current defect occurs but data can be normally read is identified as a memory block in which a short circuit exists between a word line and a bit line. To identify the memory block of a normal operation but leakage current failure, a determination method of making determination while referring to test results of various test items may be used. As the test items, the same items as conventional test items need only to be used.

Figure 24:
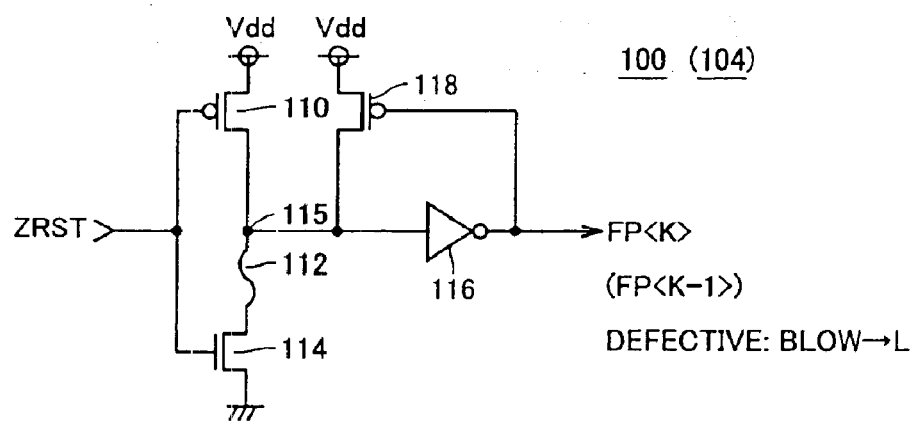
FIG. 24 shows an example of a configuration of a fuse program circuit shown in FIG. 23.

FIG. 24 shows an example of the configuration of each of fuse program circuits 100 and 104 shown in FIG. 23. Since fuse program circuits 100 and 104 are the same in configuration, FIG. 24 representatively shows the configuration of fuse program circuit 100.

In FIG. 24, fuse program circuit 100 includes a P-channel MIS transistor (insulated gate field-effect transistor) 110 which is connected between a power supply node and a node 115 and has a gate receiving a reset signal ZRST, a link element 112 having one end connected to node 115, an N-channel MIS transistor 114 which is connected between the other end of link element 112 and a ground node and has a gate receiving reset signal ZRST, an inverter circuit 116 which inverts a signal on node 115 and generates program data FP<K>, and a P-channel MIS transistor 118 which is made conductive when the output signal of inverter circuit 116 is at L level to maintain node 115 at power supply voltage Vdd level.

Reset signal ZRST is set at L level when power is turned on or in an initialization operation after system reset. When a corresponding memory block has a short-circuit defect, link element 112 is blown. In an initialization sequence, MIS transistor 110 is made conductive for a predetermined period in accordance with reset signal ZRST and transmits peripheral power supply voltage Vdd to node 115. When link element 112 is blown, a path for discharging node 115 does not exist. Therefore, node 115 is maintained at H level. At this time, program data FP<K> from inverter circuit 116 attains L level. Responsively, MIS transistor 118 is made conductive and node 115 is maintained at peripheral power supply voltage Vdd level.

If link element 112 is not blown, when reset signal ZRST attains H level after the completion of the initialization operation, node 115 is discharged to ground voltage level by link element 112 and MIS transistor 114. Accordingly, program data FP<K> from inverter circuit 116 attains H level. In this state, MIS transistor 118 is made nonconductive. By programming link element 112, it is programmed whether a short circuit exists between a word line and a bit line in the corresponding memory block.

In case of fuse program circuit 104, program data FP<K-1> is generated as indicated within brackets in FIG. 24.

Figure 25:
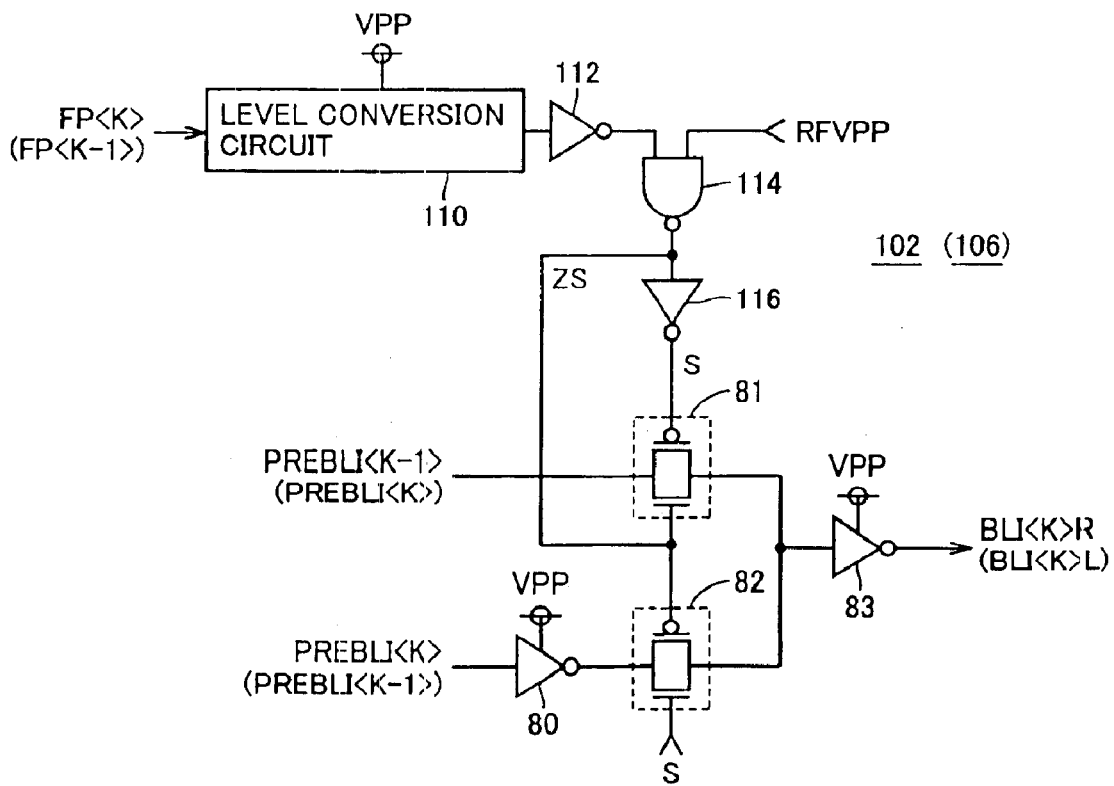
FIG. 25 shows an example of the configuration of the BLIR generation circuit and the BLIL generation circuit shown in FIG. 23.

FIG. 25 shows the configuration of BLIR generation circuit 102 shown in FIG. 23. BLIR generation circuit 102 shown in FIG. 25 differs in configuration from BLIR generation circuit 61 shown in FIG. 18 in the following points. A level conversion circuit 110 which converts program data FP<K> at peripheral power supply voltage Vdd level into program data at high voltage VPP level, an inverter circuit 112 which inverts the output signal of level conversion circuit 110, an NAND circuit 114 which receives the output signal of inverter circuit 112 and isolation control switch signal RFVPP, and inverter circuit 116 which inverts the output signal of NAND circuit 114, are provided so as to selectively control the connection between the sense amplifier band and the memory blocks in accordance with the fuse program data. CMOS transmission gate 81, receiving pre-bit line isolation control signal PREBLI<K-1>, is made conductive when the output signal S of inverter circuit 116 is at L level. CMOS transmission gate 82, receiving the output signal of inverter 80, is made conductive when the output signal ZS of NAND circuit 114 is at L level. Inverter circuit 83, similarly to the configuration shown in FIG. 18, inverts the output signal of CMOS transmission gate 81 or 82 and generates bit line isolation instruction signal BLI<K>R. Inverter circuit 80 inverts pre-bit line isolation control signal PREBLI<K>.

In BLIR generation circuit 102 shown in FIG. 25, when program data FP<K> is set at H level, the level of the output signal of inverter 112 is fixed to L level and the level of the output signal of NAND circuit 114 is fixed to H level, responsively. Therefore, CMOS transmission gate 81 is set in a constantly conductive state and CMOS transmission gate 82 is set in a constantly nonconductive state. In other words, even in the case where there is no short circuit between a word line and a bit line in the corresponding memory block, bit line isolation instruction signal BLI<K>R is generated in accordance with pre-bit line isolation control signal PREBLI<K-1> both in the normal operation mode and in the self refresh mode. Pre-bit line isolation control signal PREBLI<K-1> is generated based on memory block select signal BS<K-1>. Therefore, when the corresponding memory block (MBK<K>) is normal and no short circuit exists, then this corresponding memory block is connected to the corresponding sense amplifier bands in a standby state and isolated from the corresponding sense amplifier band when the memory block (MBK<K-1>) which shares the sense amplifier band with the corresponding memory block is selected.

When program data FP<K> is set at L level, the output signal of inverter circuit 112 attains H level and NAND circuit 114 operates as an inverter circuit. When isolation control switch signal RFVPP is at H level, output signal ZS of NAND circuit 114 attains L level and CMOS transmission gate 82 is made conductive. In the self refresh mode, therefore, when the corresponding memory block (MBK<K>) is in a standby state, the corresponding memory block is isolated from the corresponding sense amplifier bands, and connected to the corresponding sense amplifier bands when selected. When isolation control switch signal RFVPP is at L level, then output signal S of inverter 116 attains L level, CMOS transmission gate 81 is made conductive and bit line isolation instruction signal BLI<K>R is generated in accordance with pre-bit line isolation control signal PREBLI<K-1>. In this state, the corresponding memory block is isolated from the corresponding sense amplifier band when the memory block (MBK<K-1>) which shares the sense amplifier bands with the corresponding memory block is selected.

In case of BLIL generation circuit 106, pre-bit line isolation control signal PREBLI<K> is applied to CMOS transmission gate 81, and pre-bit line isolation control signal PREBLI<K-1> is applied to inverter circuit 80. Bit line isolation instruction signal BLI<K>L is outputted from inverter circuit 83.

In the self refresh mode, therefore, only the memory block in which the short circuit exists is isolated from the corresponding sense amplifier bands in a standby state and the memory block in which no short circuit exists is connected to the corresponding sense amplifier bands in the standby state. Upon transition from the self refresh mode to the normal operation mode, it is only required to drive only the bit line isolation instruction signal for this memory block in which the short circuit exists from ground voltage level to high voltage VPP level. Thus, it is possible to reduce current consumption during the mode transition from the self refresh mode to the normal operation mode. In addition, it can be prevented that the voltage level of high voltage VPP is lowered to cause a malfunction.

Modification

Figure 26:
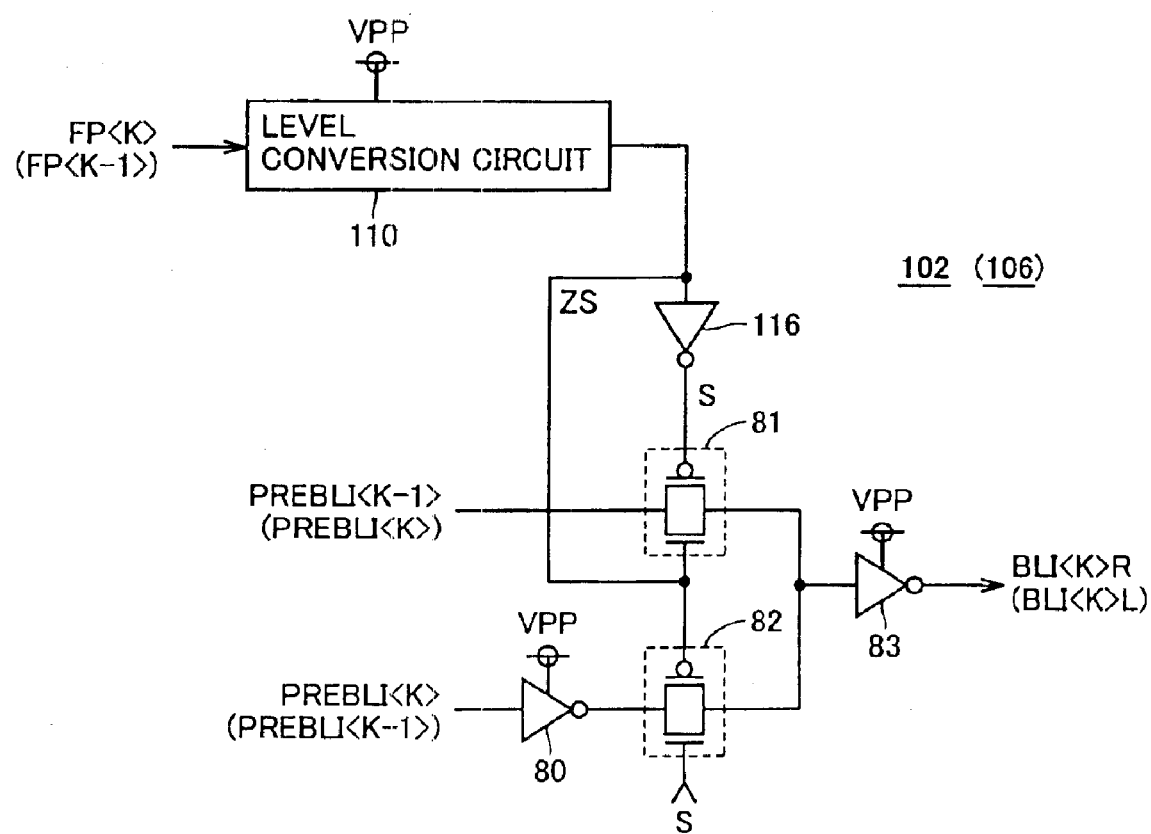
FIG. 26 shows an example of the configuration of the BLIR generation circuit and the BLIL generation circuit according to a modification of the second embodiment of the present invention.

FIG. 26 shows a modification of BLIR generation circuit 102 shown in FIG. 25. In BLIR generation circuit 102 shown in FIG. 26, the output signal of level conversion circuit 110 which receives program data FP<K> is used as switch control signal ZS for CMOS transmission gates 81 and 82. The conductive or conductive states of each of CMOS transmission gates 81 and 82 is fixed according to program data FP<K> regardless of whether the mode is the normal operation mode or the self refresh mode. Since the other components of BLIR generation circuit 102 are the same as those shown in FIG. 25, the corresponding components are denoted by the same reference numerals, and detailed description will not be repeated.

When a short circuit exists in the corresponding memory block, program data FP<K> is set at L level and output signal ZS of level conversion circuit 110 attains L level, responsively. In this case, output signal S of inverter circuit 116 attains H level, CMOS transmission gate 82 is made conductive and CMOS transmission gate 81 is made non-conductive. The corresponding memory block is isolated from the corresponding sense amplifier band in a standby state and electrically connected thereto only when it is selected.

When program data FP<K> is set at H level, output signal ZS of level conversion circuit 110 is at H level and output signal S of inverter circuit 116 is at L level. In this state, CMOS transmission gate 81 is made conductive and CMOS transmission gate 82 is made nonconductive. When no short circuit exists in the corresponding memory block, bit line isolation instruction signal BLI<K> is generated in accordance with pre-bit line isolation control signal PREBLI<K−1>. Therefore, in the standby state, the corresponding memory block is electrically connected to the corresponding sense amplifier band. The corresponding memory block is isolated from the corresponding sense amplifier band only when the memory block which shares the sense amplifier band with the corresponding memory block is selected.

In this embodiment, BLIL generation circuit 106 shown in FIG. 23 is identical in configuration to BLIR generation circuit 102 shown in FIG. 26. Signals related to BLIL generation circuit 106 are shown in brackets in FIG. 26.

A fuse program circuit is provided for each memory block and is programmed in accordance with whether or not the short circuit exists between a bit line and a word line in the corresponding memory block. It is thereby possible to set the connection between the corresponding memory block and the sense amplifier band for each memory block.

As described above, according to the second embodiment of the present invention, only the memory block in which the short-circuit defect exists is configured to be isolated from the corresponding sense amplifier bands in a standby state. It is, therefore, possible to reduce the leakage current in the standby state. In particular, since the memory block which shares a sense amplifier band with a defective memory block is connected to the corresponding sense amplifier bands in the standby state, it is possible to ensure that the sense nodes are maintained at intermediate voltage level using the bit line precharge/equalization circuit and to accurately perform the sense operation at a faster timing.

Further, the memory block in which the short-circuit defect exists is isolated from the corresponding sense amplifier band only in the self refresh mode, whereby it is possible to reduce current consumption at the time of releasing the self refresh mode.

In the embodiments described above, the short circuit between a bit line and a word line has been described. However, the present invention is also applicable to a case where a short circuit occurs between a bit line and another internal interconnection line such as a ground line.

Moreover, the semiconductor memory device may be a DRAM in which unselected word lines are set not at negative voltage level but at ground voltage level.

The DRAM may be a discrete device or an embedded memory integrated on the same semiconductor substrate with a logic.

As described above, according to the present invention, at least the memory block in which a leakage current path caused by the short circuit exists is configured to be isolated from the corresponding sense amplifier bands in the standby state. It is possible to reduce the leakage current in the standby state. In addition, in the self refresh mode in which only the data holding operation is required, the memory block in which the leakage current path due to the short circuit exists is isolated from the corresponding sense amplifier band when the memory block is unselected. It is thereby reduce to reduce current consumption in the data holding mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a plurality of memory blocks each having a plurality of memory cells arranged in rows and columns;
    a plurality of sense amplifier bands arranged in correspondence to said plurality of memory blocks so as to be shared between adjacent memory blocks, each sense amplifier band including a plurality of sense amplifiers each sensing and amplifying data in a memory cell in a corresponding memory block when activated;
    a plurality of bit line isolation circuits, arranged in correspondence to said plurality of sense amplifier bands, for electrically connecting, when made conductive, corresponding sense amplifier bands to corresponding memory blocks; and
    a bit line isolation control circuit for setting at least the bit line isolation circuit provided for a specific memory block to be nonconductive in a standby mode of operation, said specific memory block invariantly being designated.

2. The semiconductor memory device according to claim 1, wherein
    said bit line isolation control circuit maintains said plurality of bit line isolation circuits to be nonconductive in said standby mode of operation, to isolate said plurality of memory blocks from the corresponding sense amplifier bands.

3. The semiconductor memory device according to claim 1, wherein said bit line isolation control circuit includes a program circuit generating a signal for specifying said specific memory block, and the memory blocks other than said specific memory block are electrically connected to the corresponding sense amplifier bands through the corresponding bit line isolation circuits in said standby mode of operation.

4. The semiconductor memory device according to claim 1, wherein said semiconductor memory device has a normal operation mode for making data access and a data holding mode for holding data stored in the memory cells, and said bit line isolation control circuit sets said plurality of bit line isolation circuits to be nonconductive at a standby state during activation of a refresh mode instruction signal designating said data holding mode.

5. The semiconductor memory device according to claim 4, wherein said bit line isolation control circuit controls the bit line isolation circuits so as to electrically connect said plurality of memory blocks to the corresponding sense amplifier bands at said standby state when said refresh mode instruction signal designating said data holding mode is deactivated.

6. The semiconductor memory device according to claim 1, wherein said bit line isolation control circuit includes a plurality of bit line isolation select control circuits, arranged in correspondence to said bit line isolation circuits, each for selecting one of a first bit line isolation control signal generated on the basis of a first memory block select signal specifying the memory block arranged for a corresponding bit line isolation circuit and a second bit line isolation control signal generated on the basis of a second memory block select signal specifying the memory block sharing the corresponding sense amplifier band in accordance with a mode selection signal, to apply a selected one to the corresponding bit line isolation circuit as a isolation control signal, said first bit line isolation control signal and said second bit line isolation control signal being opposite in logic to each other.

7. The semiconductor memory device according to claim 6, wherein each of said bit line isolation control circuits selects said second bit line isolation control signal in accordance with said mode selection signal in a data holding mode for holding data of the memory cells, said second isolation control signal being equal in logic level to said isolation control signal when selected.

8. The semiconductor memory device according to claim 6, wherein said mode selection signal is an operation mode designation signal designating a data holding mode.

9. The semiconductor memory device according to claim 6, wherein said mode selection signal is a combined signal of an isolation select activation signal set for each memory block and a mode instruction signal designating a data holding mode, and is programmed for each of said plurality of memory blocks.

10. The semiconductor memory device according to claim 6, wherein said mode selection signal is generated for each memory block by a program circuit arranged for each of said plurality of memory blocks.

11. The semiconductor memory device according to claim 1, wherein each memory block includes a plurality of word lines arranged corresponding to the rows of the memory cells and connecting to the memory cells on corresponding rows, each word line being kept at a negative potential when nonselected.

* * * * *